US 11,805,335 B2

(12) United States Patent
Yamamoto

(10) Patent No.: US 11,805,335 B2
(45) Date of Patent: Oct. 31, 2023

(54) IMAGING DEVICE AND ELECTRONIC DEVICE

(71) Applicant: Semiconductor Energy Laboratory Co., Ltd., Atsugi (JP)

(72) Inventor: Roh Yamamoto, Toyama (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/851,138

(22) Filed: Jun. 28, 2022

(65) Prior Publication Data
US 2022/0385840 A1 Dec. 1, 2022

Related U.S. Application Data

(63) Continuation of application No. 16/621,115, filed as application No. PCT/IB2018/053999 on Jun. 5, 2018, now Pat. No. 11,388,360.

(30) Foreign Application Priority Data

Jun. 14, 2017 (JP) .................................. 2017-116689

(51) Int. Cl.
*H04N 25/77* (2023.01)
*H01L 27/146* (2006.01)
(Continued)

(52) U.S. Cl.
CPC ......... *H04N 25/77* (2023.01); *H01L 27/1461* (2013.01); *H01L 27/14616* (2013.01);
(Continued)

(58) Field of Classification Search
None
See application file for complete search history.

(56) References Cited

U.S. PATENT DOCUMENTS 6,552,746 B1 * 4/2003 Yang ..................... H04N 5/374
348/E3.018
6,665,012 B1 12/2003 Yang et al.
(Continued)

FOREIGN PATENT DOCUMENTS

EP 0989741 A 3/2000
EP 3439288 A 2/2019
(Continued)

OTHER PUBLICATIONS

International Search Report (Application No. PCT/IB2018/053999) dated Jul. 17, 2018.
(Continued)

*Primary Examiner* — James M Hannett
(74) *Attorney, Agent, or Firm* — ROBINSON INTELLECTUAL PROPERTY LAW OFFICE; Eric J. Robinson

(57) ABSTRACT

An imaging device that facilitates pooling processing. A pixel region includes a plurality of pooling modules and an output circuit, the pooling module includes a pooling circuit and a comparison module, the pooling circuit includes a plurality of pixels and an arithmetic circuit, and the comparison module includes a plurality of comparison circuits and a determination circuit. The pixel can obtain a first signal through photoelectric conversion, and can multiply the first signal by a given scaling factor to generate a second signal. The pooling circuit adds a plurality of second signals in the arithmetic circuit to generate a third signal, the comparison module compares a plurality of third signals and outputs the largest third signal to the determination circuit, and the determination circuit determines the largest third signal and binarizes it to generate a fourth signal. In the imaging device, the pooling module performs pooling pro-
(Continued)

cessing in accordance with the number of pixels and outputs data obtained by the pooling processing.

4 Claims, 15 Drawing Sheets

(51) Int. Cl.

| | | |
|---|---|---|
| H04N 25/46 | (2023.01) | |
| H04N 25/71 | (2023.01) | |
| G06N 3/02 | (2006.01) | |
| H01L 29/24 | (2006.01) | |
| H01L 29/786 | (2006.01) | |
| H01L 31/0272 | (2006.01) | |
| H01L 31/032 | (2006.01) | |

(52) U.S. Cl.
CPC ........... *H04N 25/46* (2023.01); *H04N 25/745* (2023.01); *G06N 3/02* (2013.01); *H01L 29/24* (2013.01); *H01L 29/7869* (2013.01); *H01L 31/0272* (2013.01); *H01L 31/0322* (2013.01)

(56) References Cited

U.S. PATENT DOCUMENTS

| | | | |
|---|---|---|---|
| 7,697,765 | B2 | 4/2010 | Matsugu et al. |
| 8,390,715 | B2 | 3/2013 | Matsunaga et al. |
| 9,356,585 | B2 * | 5/2016 | Sakurai .................. H03K 4/026 |
| 9,773,832 | B2 | 9/2017 | Kurokawa |
| 10,074,687 | B2 | 9/2018 | Kurokawa |
| 10,904,471 | B2 | 1/2021 | Matsumoto et al. |
| 11,475,269 | B2 | 10/2022 | Nestler et al. |
| 2005/0185835 | A1 | 8/2005 | Matsugu et al. |
| 2009/0014652 | A1 * | 1/2009 | Chammings ........... H04N 5/335 348/E5.09 |
| 2013/0126703 | A1 | 5/2013 | Caulfield |
| 2013/0153749 | A1 * | 6/2013 | Sakurai ............. H01L 27/14806 250/206 |
| 2016/0172410 | A1 | 6/2016 | Kurokawa |
| 2017/0208263 | A1 * | 7/2017 | McGarry ............... H04N 5/357 |
| 2017/0345170 | A1 * | 11/2017 | Carmel ................... G06T 9/002 |
| 2019/0067360 | A1 | 2/2019 | Kurokawa |
| 2019/0180499 | A1 * | 6/2019 | Caulfield ................ G06T 15/08 |
| 2021/0105426 | A1 | 4/2021 | Matsumoto et al. |

FOREIGN PATENT DOCUMENTS

| | | |
|---|---|---|
| JP | 02-242488 A | 9/1990 |
| JP | 2000-076436 A | 3/2000 |
| JP | 2000-138863 A | 5/2000 |
| JP | 2005-215988 A | 8/2005 |
| JP | 2009-064162 A | 3/2009 |
| JP | 2010-259027 A | 11/2010 |
| JP | 2013-146045 A | 7/2013 |
| JP | 2016-123087 A | 7/2016 |
| JP | 2019-504400 | 2/2019 |
| WO | WO-2005114749 A1 * 12/2005 ....... H01L 27/14634 |
| WO | WO-2017/106464 | 6/2017 |
| WO | WO-2017/168665 | 10/2017 |

OTHER PUBLICATIONS

Written Opinion (Application No. PCT/IB2018/053999) dated Jul. 17, 2018.

Chinese Office Action (Application No. 201880039316.8) dated Sep. 29, 2021.

* cited by examiner

FIG. 14A1
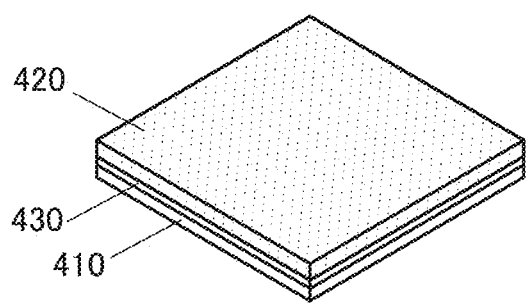
FIG. 14B1
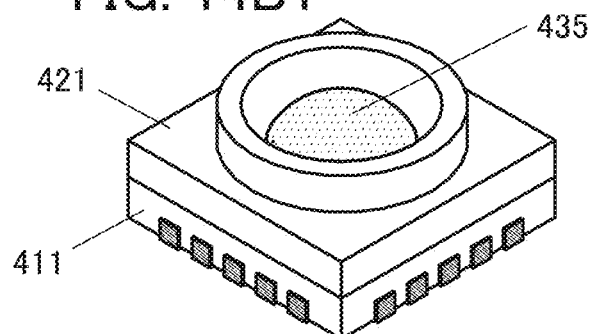
FIG. 14A2
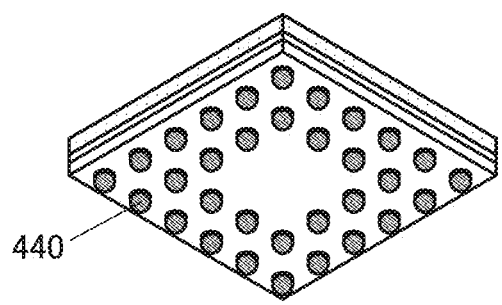
FIG. 14B2
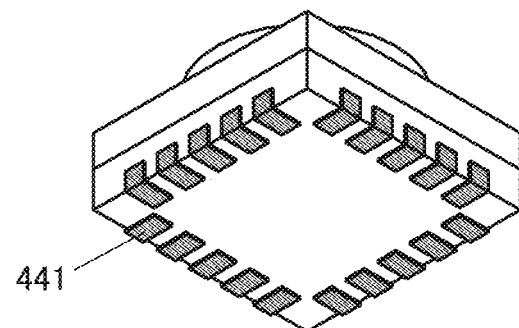
FIG. 14A3
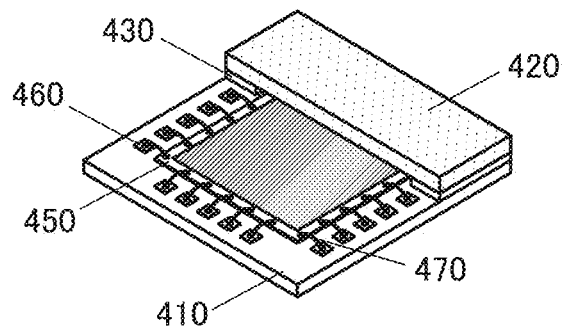
FIG. 14B3
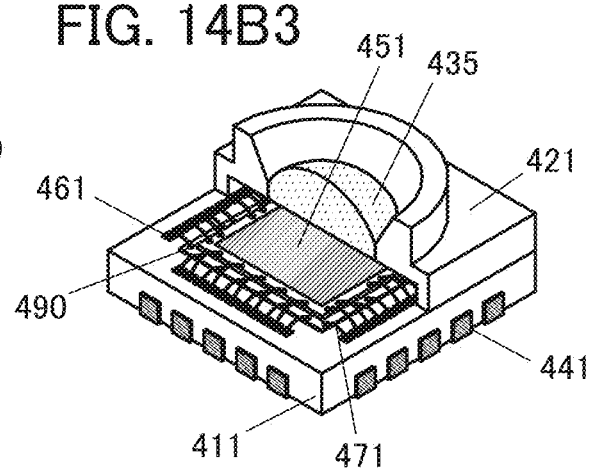

IMAGING DEVICE AND ELECTRONIC DEVICE

TECHNICAL FIELD

One embodiment of the present invention relates to an imaging device and an electronic device.

Note that one embodiment of the present invention is not limited to the above technical field. The technical field of one embodiment of the invention disclosed in this specification and the like relates to an object, a method, or a manufacturing method. In particular, one embodiment of the present invention relates to a semiconductor device, a display device, a light-emitting device, a power storage device, a memory device, a driving method thereof, or a manufacturing method thereof.

In this specification and the like, a semiconductor device means an element, a circuit, a device, or the like that can function by utilizing semiconductor characteristics. As an example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

With the development of information technology such as IoT (Internet of things) or AI (Artificial Intelligence), the amount of handled data has been showing an increasing tendency. In order that electronic devices utilize information technology such as IoT or AI, dispersive control of a large amount of data has been needed.

An increase in image recognition processing speed with use of AI for an image processing system of an in-vehicle electronic device, an image processing system that monitors a moving target, and the like has been attracting attention. For example, technology of adding an arithmetic operation function to an imaging device is disclosed in Patent Document 1.

REFERENCES

Patent Documents

[Patent Document 1] Japanese Published Patent Application No. 2016-123087

SUMMARY OF THE INVENTION

Problems to be Solved by the Invention

Imaging devices provided with a solid-state imaging element such as a CMOS image sensor can capture a high quality image easily owing to the development of technology. In the next generation, imaging devices need to have more intelligent functions.

In order to recognize a target from image data, advanced image processing is required. In the advanced image processing, various kinds of analysis processing for analyzing an image, such as filter processing and comparison arithmetic processing, are used. In the analysis processing for image processing, the arithmetic amount is increased in accordance with the number of pixels to be processed, and the processing time is increased in accordance with the arithmetic amount. In an in-vehicle image processing system, for example, there is a problem that an increase in processing time affects safety. In addition, in an image processing system, there is a challenge that power consumption is increased because of an increase in the arithmetic amount.

In view of the above problems, an object of one embodiment of the present invention is to provide an imaging device with a novel structure. Another object of one embodiment of the present invention is to provide an imaging device having a pooling processing function of a neural network. Another object of one embodiment of the present invention is to provide an imaging device with a novel structure that can shorten processing time by reducing the arithmetic amount. Another object of one embodiment of the present invention is to provide an imaging device with a novel structure that can reduce power consumption.

Note that the descriptions of these objects do not disturb the existence of other objects. One embodiment of the present invention does not need to achieve all the objects. Other objects will be apparent from the description of the specification, the drawings, the claims, and the like, and other objects can be derived from the description of the specification, the drawings, the claims, and the like.

Note that the objects of one embodiment of the present invention are not limited to the objects listed above. The objects listed above do not preclude the existence of other objects. The other objects are the objects that are not described in this section and will be described below. Objects that are not described in this section will be apparent from the description of the specification, the drawings, and the like and can be derived from the description by those skilled in the art. One embodiment of the present invention is to solve at least one object of the objects listed above and/or the other objects.

Means for Solving the Problems

One embodiment of the present invention is an imaging device including a pixel region and a first circuit. The pixel region includes a pooling module and an output circuit; the pooling module includes a plurality of pooling circuits and a comparison module; the pooling circuit includes a plurality of pixels and an arithmetic circuit; the comparison module includes a plurality of comparison circuits and a determination circuit; the pixel has a function of obtaining a first signal through photoelectric conversion; the pixel has a function of multiplying the first signal by a given scaling factor to generate a second signal; the pooling circuit has a function of adding a plurality of the second signals in the arithmetic circuit to generate a third signal; the comparison module has a function of comparing a plurality of the third signals, selecting the largest third signal, and outputting the largest third signal to the determination circuit; the determination circuit has a function of determining the largest third signal and binarizing the largest third signal to generate a fourth signal; the first circuit controls timing at which the fourth signal is output to the output circuit; the pooling module performs pooling processing in accordance with the number of the pixels; and the pooling module outputs the fourth signal generated by the pooling processing.

In the above structure, the imaging device further including a second circuit, a third circuit, a first wiring, a second wiring, and a third wiring. The imaging device in which the pixel includes a first output terminal; the arithmetic circuit includes a first transistor, a second transistor, and a third transistor; the second circuit is electrically connected to the plurality of pixels extending in a row direction through the first wiring; the third circuit is electrically connected to the plurality of pixels extending in a column direction through the second wiring; the third wiring is electrically connected to one of a source and a drain of the first transistor, one of a source and a drain of the second transistor, and one of a source and a drain of the third transistor; a gate of the first transistor is electrically connected to the other of the source and the drain of the first transistor, a gate of the second transistor, a gate of the third transistor, and the first output terminal of the pixel of the pooling circuit; the third circuit has a function of outputting a selection signal to the second wiring; the second circuit has a function of setting a given scaling factor for the pixel through the first wiring; the first transistor has the same channel length as the second transistor and the third transistor; the second transistor has the same channel width as the first transistor and thus has a function of outputting the third signal obtained by adding the plurality of the second signals; and the third transistor has a length obtained by dividing the channel width of the first transistor by the number of the pixels of the pooling circuit and thus has a function of outputting a fifth signal having a level obtained by dividing a level of the third signal by the number of the pixels is preferable.

In the above structure, the imaging device in which the comparison module includes a first comparison circuit, a second comparison circuit, and a current mirror circuit; the first comparison circuit includes fourth to ninth transistors, a first input terminal, a second input terminal, a second output terminal, and a fourth wiring; the second output terminal of the first comparison circuit is electrically connected to the first input terminal of the second comparison circuit through the current mirror circuit; the first input terminal is electrically connected to one of a source and a drain of the fifth transistor, one of a source and a drain of the seventh transistor, a gate of the fourth transistor, a gate of the fifth transistor, and a gate of the sixth transistor; the second input terminal is electrically connected to one of a source and a drain of the eighth transistor, one of a source and a drain of the sixth transistor, a gate of the seventh transistor, a gate of the eighth transistor, and a gate of the ninth transistor; the second output terminal is electrically connected to one of a source and a drain of the fourth transistor and one of a source and a drain of the ninth transistor; the fourth transistor to the ninth transistor have the same channel length; a channel width of the fourth transistor is preferably the same as a channel width of the fifth transistor; a channel width of the sixth transistor is preferably twice the channel width of the fifth transistor; the fourth transistor to the sixth transistor form a first current mirror circuit; a channel width of the ninth transistor is preferably the same as a channel width of the eighth transistor; a channel width of the seventh transistor is preferably twice the channel width of the eighth transistor; the seventh transistor to the ninth transistor form a second current mirror circuit; a sixth signal is supplied to the first input terminal of the first comparison circuit; a seventh signal is supplied to the second input terminal of the first comparison circuit; the second output terminal of the first comparison circuit outputs the higher signal of the sixth signal and the seventh signal as an eighth signal; the eighth signal is supplied to the first input terminal of the second comparison circuit; a ninth signal is supplied to the second input terminal of the second comparison circuit; the second output terminal of the second comparison circuit outputs the higher signal of the eighth signal and the ninth signal, as a tenth signal, to the determination circuit; the determination circuit has a function of determining the tenth signal and binarizing the tenth signal to generate the fourth signal; and the first circuit has a function of controlling timing at which the fourth signal is output to the output circuit is preferable.

In the above structure, the imaging device in which the plurality of pixels are arranged in a matrix and a region shielded from light is between adjacent pixels is preferable.

In the above structure, the imaging device in which the pixel further includes a photoelectric conversion element, a tenth transistor, an eleventh transistor, a twelfth transistor, a thirteenth transistor, and a first capacitor; one electrode of the photoelectric conversion element is electrically connected to one of a source and a drain of the tenth transistor; the other of the source and the drain of the tenth transistor is electrically connected to one of a source and a drain of the eleventh transistor; the one of the source and the drain of the eleventh transistor is electrically connected to a gate of the twelfth transistor; the gate of the twelfth transistor is electrically connected to one electrode of the first capacitor; one of a source and a drain of the twelfth transistor is electrically connected to the first output terminal; the other electrode of the first capacitor is electrically connected to one of a source and a drain of the thirteenth transistor; the other of the source and the drain of the thirteenth transistor is electrically connected to the first wiring; a gate of the thirteenth transistor is electrically connected to the second wiring; and the tenth transistor and the twelfth transistor include a metal oxide in a channel formation region is preferable.

In the above structure, the imaging device in which the metal oxide contains In, Zn, and M (M is Al, Ti, Ga, Sn, Y, Zr, La, Ce, Nd, or Hf) is preferable.

In the above structure, the imaging device in which the photoelectric conversion element includes selenium or a compound containing selenium is preferable.

Effect of the Invention

In view of the above problems, one embodiment of the present invention can provide an imaging device with a novel structure. Another embodiment of the present invention can provide an imaging device having a pooling processing function of a neural network. Another embodiment of the present invention can provide an imaging device with a novel structure that can shorten processing time by reducing the arithmetic amount. Another embodiment of the present invention can provide an imaging device with a novel structure that can reduce power consumption.

Note that the effects of one embodiment of the present invention are not limited to the effects listed above. The effects listed above do not preclude the existence of other effects. The other effects are the effects that are not described in this section and will be described below. Effects that are not described in this section will be apparent from the description of the specification, the drawings, and the like and can be derived from the description by those skilled in the art. One embodiment of the present invention is to solve at least one effect of the effects listed above and/or the other effects. Therefore, one embodiment of the present invention does not have the effects listed above in some cases.

BRIEF DESCRIPTION OF DRAWINGS

FIG. 14 (A1)-(B3) Perspective views of packages and modules including imaging devices.

MODE FOR CARRYING OUT THE INVENTION

Embodiment 1

In this embodiment, an imaging device in which pooling processing of a neural network is efficiently performed is described with reference to FIG. 1 to FIG. 7.

Figure 1:
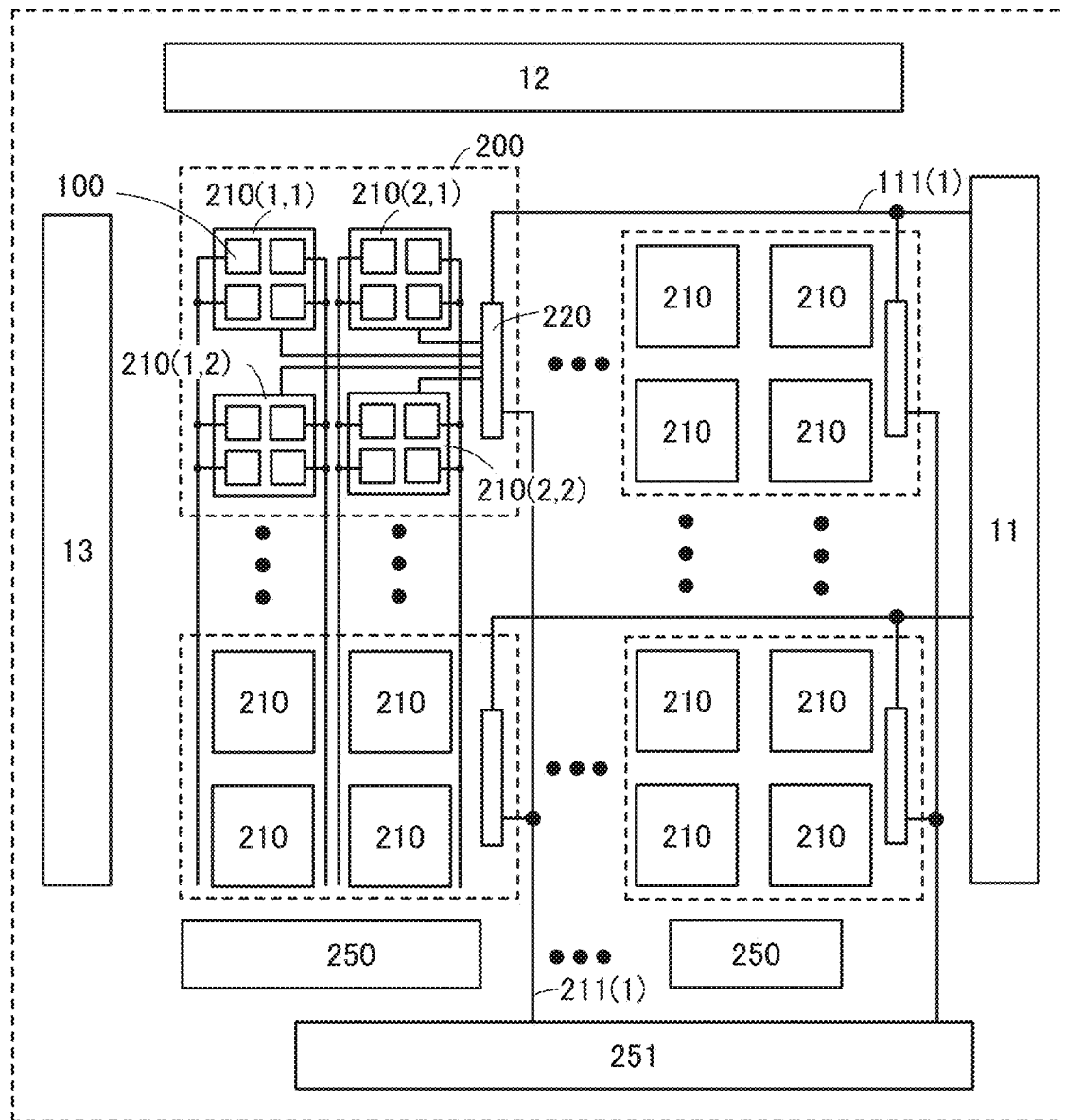
FIG. 1 A block diagram illustrating an imaging device.

First, a block diagram of an imaging device 10 is described with reference to FIG. 1. The imaging device 10 includes a pixel region, a driver 11, a driver 12, a driver 13, a plurality of wirings 111, a plurality of wirings 112 (not illustrated), and a plurality of wirings 113a (not illustrated). The pixel region includes a plurality of pooling modules 200, a plurality of analog/digital converter circuits 250, and an output circuit 251. The pooling module 200 includes a plurality of pooling circuits 210 and a comparison module 220, and the pooling circuit 210 includes a plurality of pixels 100 and an arithmetic circuit 212 (not illustrated). The comparison module 220 includes a plurality of comparison circuits 230 (not illustrated) and a determination circuit 221 (not illustrated).

The pixel 100 can obtain a first signal by converting light into an electric signal, and the pixel 100 can generate a second signal by multiplying the first signal by a given scaling factor. The first signal and the second signal are output as current. The given scaling factor refers to a value of weight data used for pooling processing of a neural network.

The pooling circuit 210 can generate a third signal by adding a plurality of second signals in the arithmetic circuit 212. Furthermore, the arithmetic circuit 212 can generate a fifth signal by averaging the plurality of second signals.

The comparison module 220 can compare a plurality of third signals, select the largest third signal, and output it to the determination circuit 221. The determination circuit 221 can determine the largest third signal and binarize it to generate a fourth signal.

The pooling module 200 can perform pooling processing in accordance with the number of the pixels included in the pooling module 200. That is, the pooling module 200 can output the fourth signal generated by performing pooling processing on the first signals obtained from the plurality of pixels included in the pooling module 200.

The driver 11 can control the timing at which the fourth signal is output to the output circuit 251 with a selection signal supplied to the wiring 111. Although not illustrated in the drawing, the output circuit 251 can output the fourth signal to a neural network that controls the imaging device 10. First data is subjected to pooling processing by the imaging device 10 and the processed first data is input to the neural network as data obtained by extracting features of the data. Thus, the neural network needs to process only the features of the extracted data, and thus the amount of data required to be processed can be reduced. Thus, time for transferring data from the imaging element to the neural network is shortened and the arithmetic amount in the neural network can be reduced. Reduction in the arithmetic amount in the neural network can reduce power consumption.

The pooling module 200 preferably includes the plurality of pooling circuits 210. FIG. 1 illustrates an example in which the pooling module 200 includes four pooling circuits 210. The number of the pooling circuits 210 included in the pooling module 200 can be greater than or equal to 1 and less than or equal to n (n is a natural number greater than or equal to 2). The features of data are easily extracted by including the plurality of pooling circuits. When the number of the pixels included in the pooling circuit 210 is increased, the compressibility of data becomes high, whereby the arithmetic amount in the neural network is reduced. Therefore, the power consumption of the neural network is further reduced.

Figure 2:
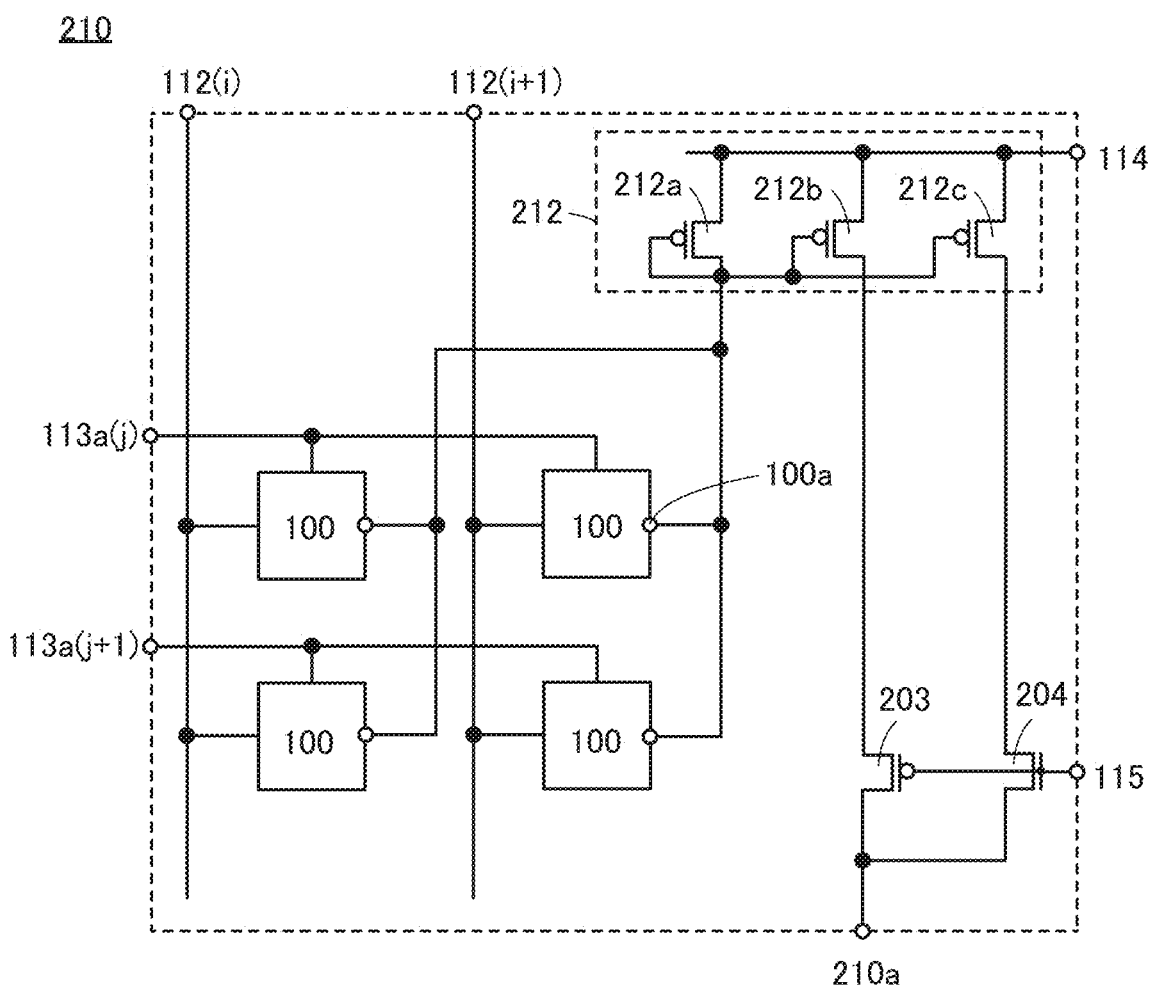
FIG. 2 A block diagram illustrating an imaging device.

FIG. 2 illustrates an example of the pooling circuit 210 using a block diagram. The pooling circuit 210 includes the plurality of pixels 100, the arithmetic circuit 212, a switch 203, a switch 204, the plurality of wirings 112, the plurality of wirings 113a, a wiring 114, a wiring 115, and a wiring 210a. The pixel 100 includes a first output terminal, and the arithmetic circuit 212 includes a transistor 212a, a transistor 212b, and a transistor 212c. Note that an example in which the pooling circuit 210 illustrated in FIG. 2 includes four pixels is described.

The driver 12 is electrically connected to the plurality of pixels 100 extending in the row direction through the wiring 112, and the driver 13 is electrically connected to the plurality of pixels 100 extending in the column direction through the wiring 113a.

The wiring 114 is electrically connected to one of a source and a drain of the transistor 212a, one of a source and a drain of the transistor 212b, and one of a source and a drain of the transistor 212c. A gate of the transistor 212a is electrically connected to the other of the source and the drain of the transistor 212a, a gate of the transistor 212b, and a gate of the transistor 212c. The gate of the transistor 212a is further electrically connected to output terminals 100a of the plurality of pixels 100 included in the pooling circuit 210.

The other of the source and the drain of the transistor 212b is electrically connected to one electrode of the switch 203, and the other of the source and the drain of the transistor 212c is electrically connected to one electrode of the switch 204. The other electrode of the switch 203 is electrically connected to the other electrode of the switch 204 and the comparison module 220 through the wiring 210a.

The driver 13 can output a selection signal to the wiring 113a. The driver 12 can set a given scaling factor as weight data for the pixel 100 through the wiring 112. The transistor 212a has the same channel length as the transistor 212b and the transistor 212c, and the transistor 212b has the same channel width as the transistor 212a; thus, the third signal obtained by adding the plurality of second signals can be output. The transistor 212c having a channel width obtained by dividing the channel width of the transistor 212a by the number of the pixels 100 included in the pooling circuit 210 can output the fifth signal with a level obtained by dividing the level of the third signal by the number of the pixels 100. The third signal and the fifth signal are controlled by current. The switch 203 and the switch 204 are preferably complementary.

The switch 203 and the switch 204 are controlled by a first switching signal supplied to the wiring 115. FIG. 2 illustrates an example in which a p-channel transistor is used as the switch 203 and an n-channel transistor is used as the switch 204.

When the first switching signal is at "L", the pooling circuit 210 can output the third signal to the comparison module 220 through the wiring 210a.

When the first switching signal is at "H", the pooling circuit 210 can output the fifth signal to the comparison module 220 through the wiring 210a.

An in-vehicle image processing system is required to instantly determine the situation around a car moving at high speed, for example. Therefore, the imaging device 10 including the pooling module 200 specializes in detecting features from imaging data, whereby the arithmetic amount can be reduced and processing time can be shortened.

Note that FIG. 2 illustrates an example in which different weight data are supplied to the pixels 100 included in the pooling circuit 210. Alternatively, the same weight data may be supplied to the pooling circuit 210 or the pooling module 200 regarded as one unit. Thus, the wiring 112 and the wiring 113a may be electrically connected to the pooling circuit 210 or the pooling module 200 regarded as one unit. The number of the wirings 112 and the wirings 113a is reduced, whereby the integration degree of the imaging device 10 can be increased.

Figure 3A:
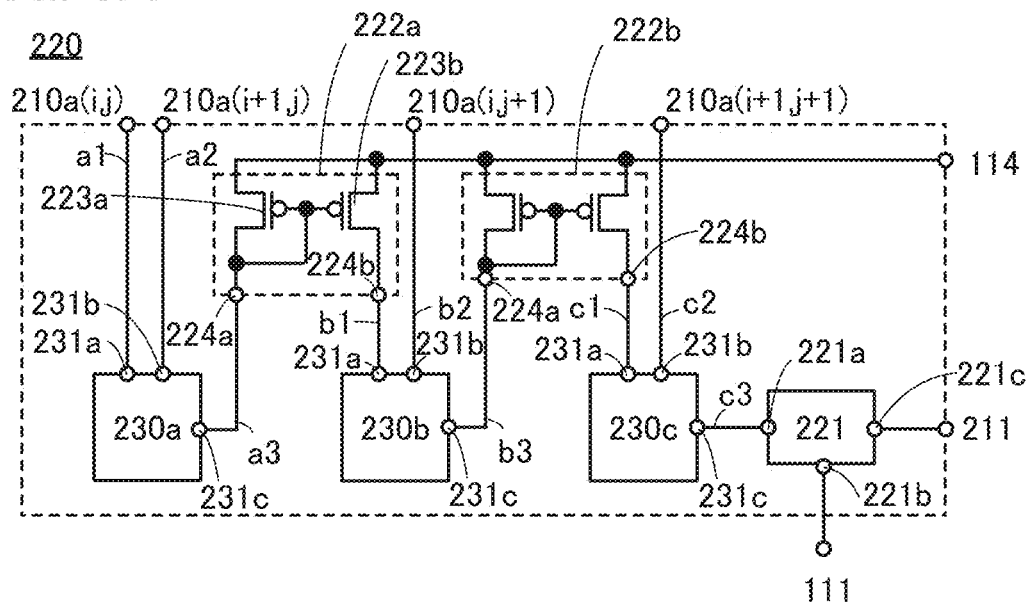
FIG. 3 (A) A block diagram illustrating an imaging device. (B) A circuit diagram illustrating an imaging device.

FIG. 3(A) illustrates an example of the comparison module 220 using a block diagram. The comparison module 220 includes the plurality of comparison circuits 230, a plurality of current mirror circuits 222, and the determination circuit 221. Each of the comparison circuits 230 includes an input terminal 231a, an input terminal 231b, and an output terminal 231c. The determination circuit 221 includes an input terminal 221a, an input terminal 221b, and an output terminal 221c. The current mirror circuit 222 includes an input terminal 224a and an output terminal 224b.

FIG. 3(A) illustrates an example in which output signals from four pooling circuits 210 are supplied to the comparison module 220. The comparison module 220 is electrically connected to four different pooling circuits 210 through a wiring 210a(i,j) to a wiring 210a(i+1,j+1). The comparison circuits 230 whose number corresponds to the number of input signals are preferably provided. In the example illustrated in FIG. 3(A), the comparison module 220 includes a comparison circuit 230a, a comparison circuit 230b, a comparison circuit 230c, a current mirror circuit 222a, a current mirror circuit 222b, and the determination circuit 221.

Next, a connection example of the comparison circuit 230a, the comparison circuit 230b, the comparison circuit 230c, the current mirror circuit 222a, the current mirror circuit 222b, and the determination circuit 221 is described. The wiring 210a(i, j) is electrically connected to the input terminal 231a of the comparison circuit 230a, the wiring 210a(i+1,j) is electrically connected to the input terminal 231b, the input terminal 224a of the current mirror circuit 222a is electrically connected to the output terminal 231c, and the input terminal 231a of the comparison circuit 230b is electrically connected to the output terminal 224b of the current mirror circuit 222a.

The wiring 210a(i,j+1) is electrically connected to the input terminal 231b of the comparison circuit 230b, the input terminal 224a of the current mirror circuit 222b is electrically connected to the output terminal 231c, and the input terminal 231a of the comparison circuit 230c is electrically connected to the output terminal 224b of the current mirror circuit 222b. The wiring 210a(i+1,j+1) is electrically connected to the input terminal 231b of the comparison circuit 230c, and the input terminal 221a of the determination circuit 221 is electrically connected to the output terminal 231c.

The current mirror circuit 222 includes a transistor 223a and a transistor 223b. The transistor 223a and the transistor 223b are preferably p-channel transistors. One of a source and a drain of the transistor 223a is electrically connected to one of a source and a drain of the transistor 223b and the wiring 114. A gate of the transistor 223a is electrically connected to the other of the source and the drain of the transistor 223a and a gate of the transistor 223b.

A signal a1 is supplied to the input terminal 231a of the comparison circuit 230a through the wiring 210a(i,j). A signal a2 is supplied to the input terminal 231b through the wiring 210a(i+1,j). The higher signal of the signal a1 and the signal a2 is output from the output terminal 231c as a signal a3 and supplied to the input terminal 224a of the current mirror circuit 222a. The signal a3 which has passed through the current mirror circuit 222a becomes a signal b1 having the same level as the signal a3 and is supplied to the output terminal 224b of the current mirror circuit. Thus, the signal b1 having the same level as the signal a3 is supplied to the input terminal 231a of the comparison circuit 230b. Note that the signal a3 and the signal b1 differ in signal directions.

A signal b2 is supplied to the input terminal 231b of the comparison circuit 230b through the wiring 210a(i,j+1), and the higher signal of the signal b1 and the signal b2 is output as a signal b3 from the output terminal 231c. A signal c1 is supplied to the input terminal 231a of the comparison circuit 230c through the current mirror circuit 222b, a signal c2 is supplied to the input terminal 231b through the wiring 210a(i+1,j+1), and the higher signal of the signal c1 and the signal c2 is output as a signal c3 from the output terminal 231c to the determination circuit 221. All the signals a1, a2, a3, b1, b2, b3, c1, c2, and c3 are preferably analog signals.

Accordingly, the determination circuit 221 can determine the signal c3 input to the input terminal 221a, binarize the signal c3 to generate the fourth signal, and output it to the output terminal 221c. The driver 11 can control the timing at which the fourth signal is output to the output circuit 251 through a wiring 211 with a selection signal supplied to the wiring 111.

Figure 3B:
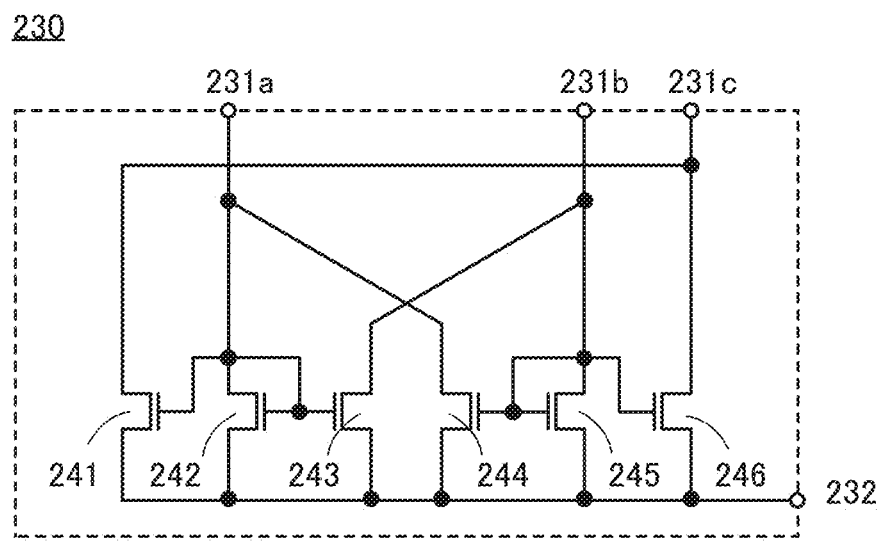

FIG. 3(B) illustrates a circuit diagram of the comparison circuit 230. The comparison circuit 230 includes a transistor 241 to a transistor 246, the input terminal 231a, the input terminal 231b, the output terminal 231c, and a wiring 232.

The input terminal 231a is electrically connected to one of a source and a drain of the transistor 242, one of a source and a drain of the transistor 244, a gate of the transistor 241, a gate of the transistor 242, and a gate of the transistor 243. The input terminal 231b is electrically connected to one of a source and a drain of the transistor 245, one of a source and a drain of the transistor 243, a gate of the transistor 244, a gate of the transistor 245, and a gate of the transistor 246. The output terminal 231c is electrically connected to one of a source and a drain of the transistor 241 and one of a source and a drain of the transistor 246. The wiring 232 is electrically connected to the others of the source and the drain of each of the transistor 241 to the transistor 246.

Moreover, the transistor 241 to the transistor 246 have the same channel length.

The channel width of the transistor 241 is preferably the same as the channel width of the transistor 242, and the channel width of the transistor 243 is preferably twice the channel width of the transistor 242. The transistor 241 to the transistor 243 form a first current mirror circuit.

The channel width of the transistor 246 is preferably the same as the channel width of the transistor 245, and the channel width of the transistor 244 is preferably twice the channel width of the transistor 245. The transistor 244 to the transistor 246 form a second current mirror circuit.

Next, the operation of the comparison circuit 230 is described. Note that current is supplied as an analog signal to the input terminal 231a and the input terminal 231b and the output terminal 231c sinks current as an analog signal. When a signal input to the input terminal 231a is higher than a signal input to the input terminal 231b, for example, the signal supplied to the input terminal 231b is sunk by the transistor 243. For another example, when a signal input to the input terminal 231b is higher than a signal input to the input terminal 231a, the signal supplied to the input terminal 231a is sunk by the transistor 244. Thus, the output terminal 231c can sink a signal having the same level as the higher signal of the signals input to the input terminal 231a and the input terminal 231b by the first current mirror circuit or the second current mirror circuit.

Note that when signals input to the input terminal 231a and the input terminal 231b have the same level, the levels of the signals sunk by the transistor 242 and the transistor 245 are each half the levels of the signals. Thus, the output terminal 231c sinks a signal having the level obtained by synthesizing the signals of the transistor 241 and the transistor 246. Accordingly, the output terminal 231c can sink a signal having the same level as those of the input terminal 231a and the input terminal 231b. The wiring 232 preferably has a low potential at which a signal can be sunk.

Thus, the highest signal of the signals a1, a2, b2, and c2 supplied to the comparison module 220 is supplied as the signal c3 to the determination circuit 221 in FIG. 3(A). The determination circuit 221 can determine the signal c3 and binarize it to generate the fourth signal. The driver 11 can supply a selection signal to the determination circuit 221 through the wiring 111, whereby a determination result can be output to the output circuit 251.

Figure 4:
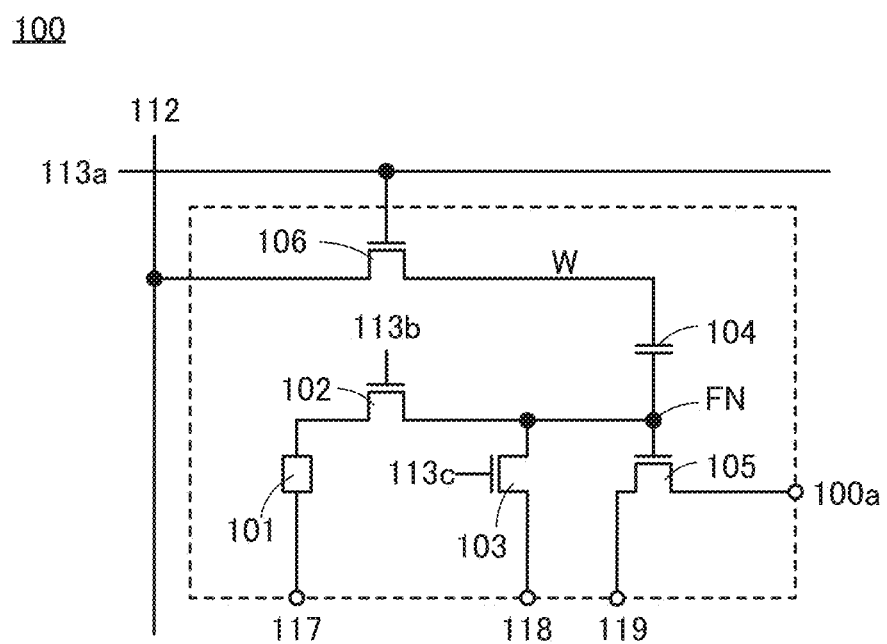
FIG. 4 A circuit diagram illustrating a pixel.

FIG. 4 illustrates an example of the pixel 100 using a circuit diagram. The pixel 100 includes a photoelectric conversion element 101, a transistor 102, a transistor 103, a capacitor 104, a transistor 105, a transistor 106, and the output terminal 100a. The pixel 100 is electrically connected to the wiring 112, the wiring 113a, a wiring 113b, a wiring 117, a wiring 118, and a wiring 119.

One electrode of the photoelectric conversion element 101 is electrically connected to one of a source and a drain of the transistor 102. The other of the source and the drain of the transistor 102 is electrically connected to one of a source and a drain of the transistor 103, a gate of the transistor 105, and one electrode of the capacitor 104. One of a source and a drain of the transistor 105 is electrically connected to the output terminal 100a, and the other electrode of the capacitor 104 is electrically connected to one of a source and a drain of the transistor 106. The other of the source and the drain of the transistor 106 is electrically connected to the wiring 112, and a gate of the transistor 106 is electrically connected to the wiring 113a. A gate of the transistor 102 is electrically connected to the wiring 113b. A gate of the transistor 103 is electrically connected to a wiring 113c. The other of the source and the drain of the transistor 103 is electrically connected to the wiring 118. The other electrode of the photoelectric conversion element 101 is electrically connected to the wiring 117. The other of the source and the drain of the transistor 105 is electrically connected to the wiring 119.

A node FN is formed by being connected to the other of the source and the drain of the transistor 102, the one of the source and the drain of the transistor 103, the gate of the transistor 105, and the one electrode of the capacitor 104. Note that the capacitor 104 may be not provided.

The transistor 103 can be turned on by a signal supplied to the wiring 113c. Thus, the node FN can be initialized by a reset potential supplied to the wiring 118. The transistor 102 can be turned on by a signal supplied to the wiring 113b. Thus, the photoelectric conversion element 101 can update data at the node FN with imaging data subjected to photoelectric conversion through the transistor 102. The transistor 102 can be turned off by a signal supplied to the wiring 113b. When the transistor 102 is turned off, the node FN can retain the imaging data. Therefore, the first signal refers to current flowing while the imaging data is supplied to the gate of the transistor 105.

Although FIG. 4 illustrates an example in which an n-channel transistor is used as the transistor 105, a p-channel transistor may be used. Note that in the case where the transistor 105 is of an n-channel type, potential supplied to the wiring 119 is preferably a low potential, and also in the case where the transistor 105 is of a p-channel type, potential supplied to the wiring 119 is preferably a low potential.

The transistor 106 can be turned on by a signal supplied to the wiring 113a. Weight data can be supplied from the wiring 112 to the capacitor 104 through the transistor 106. The node FN is preferably a floating node when the transistor 102 and the transistor 103 are off. Thus, transistors with a low off-state current are preferably used as the transistor 102 and the transistor 103. A transistor including a metal oxide in a channel formation region (OS transistor) is preferably used as a transistor with a low off-state current. The OS transistor will be described in detail in Embodiment 2.

Weight data is added to the imaging data retained at the node FN through the capacitor 104. In other words, data voltage obtained by adding the weight data to the imaging data is supplied to the gate of the transistor 105. Thus, the transistor 105 can perform multiplication by a given scaling factor of weight data using the conductance of the transistor 105. Therefore, the second signal refers to current flowing while data voltage obtained by adding the weight data to the imaging data is supplied to the gate of the transistor 105.

Figure 5A:
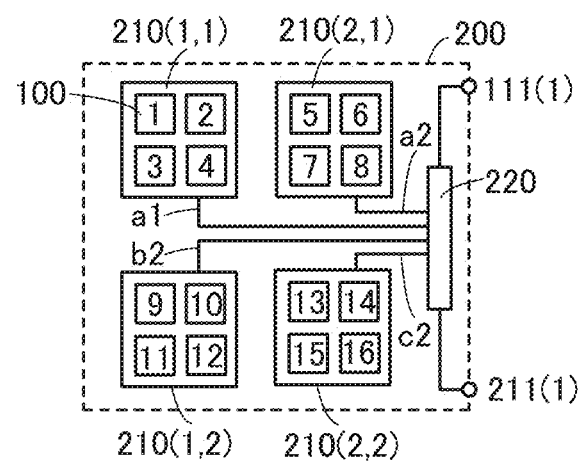
FIG. 5 (A) A block diagram illustrating an imaging device. (B) A timing chart illustrating the operation of an imaging device.

FIG. 5 illustrates an example of an operation method of the pooling module 200. FIG. 5(A) illustrates an example in which the pooling module 200 includes four pooling circuits 210 and the comparison module 220 for simplicity of description. In addition, an example in which the pooling circuit 210 includes four pixels is illustrated. However, there is no limitation on the number of the pooling modules 200 included in the imaging device 10.

Figure 5B:
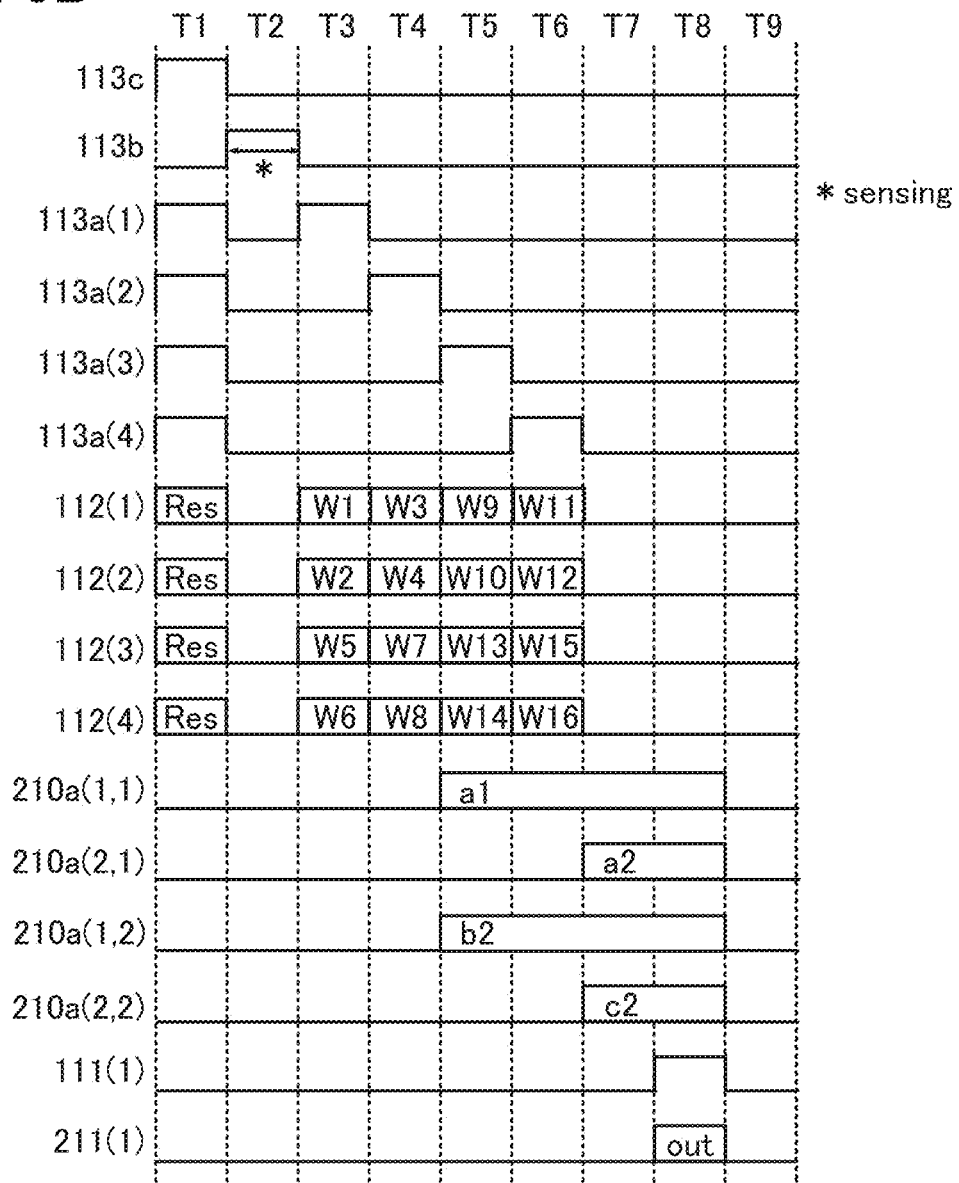

In FIG. 5(B), a timing chart shows an example of an operation method of the pooling module 200 in FIG. 5(A). Although not illustrated in the drawing, the timing chart illustrated in FIG. 5(B) shows an example in which an L signal is supplied to the wiring 115 and the pooling circuit 210 performs adding processing of the first signals of the plurality of pixels 100.

In T1, an H signal is supplied to the wiring 113c so that the transistor 103 of each of the pixels 100 is turned on. The node FN is reset by potential supplied to the wiring 118. Furthermore, to the wiring 113*a*, a selection signal is supplied and an initial value Res of weight data is supplied through the wiring 112.

In T2, an H signal is supplied to the wiring 113*b*, each of the pixels 100 is subjected to photoelectric conversion by the photoelectric conversion element 101 (sensing), and the node FN is updated by the imaging data.

In T3, an L signal is supplied to the wiring 113*b* so that the imaging data at the node FN is determined. Then, a selection signal is supplied to a wiring 113*a*(1) and weight data of a pixel 100(1), a pixel 100(2), a pixel 100(5), and a pixel 100(6) are set through a wiring 112(1) to a wiring 112(4).

In T4, a selection signal is supplied to a wiring 113*a*(2) and weight data of a pixel 100(3), a pixel 100(4), a pixel 100(7), and a pixel 100(8) are set through the wiring 112(1) to the wiring 112(4).

In T5, a selection signal is supplied to a wiring 113*a*(3) and weight data of a pixel 100(9), a pixel 100(10), a pixel 100(13), and a pixel 100(14) are set through the wiring 112(1) to the wiring 112(4). Moreover, a pooling circuit 210(1, 1) outputs the data signal a1 obtained by adding the weight data to the imaging data to a wiring 210*a*(1, 1). Furthermore, a pooling circuit 210(2, 1) outputs the signal a2 obtained by adding the weight data to the imaging data to a wiring 210*a*(2, 1).

In T6, a selection signal is supplied to a wiring 113*a*(4) and weight data of a pixel 100(11), a pixel 100(12), a pixel 100(15), and a pixel 100(16) are set through the wiring 112(1) to the wiring 112(4).

In T7, the pooling circuit 210(1, 1) outputs the data signal b2 obtained by adding the weight data to the imaging data to a wiring 210*a*(1, 2). Moreover, a pooling circuit 210(2, 2) outputs the signal c2 obtained by adding the weight data to the imaging data to a wiring 210*a*(2, 2).

In T8, the comparison module 220 detects the highest signal of a1, a2, b2, and c2. The determination circuit 221 included in the comparison module 220 determines the detected highest signal and binarizes it to output digital signals out to the wiring 211. The digital signals out are supplied to the output circuit 251. The output circuit 251 combines the digital signals out and outputs the signal obtained by the combining as digital data having an arbitrary data width so that it can be easily handled in the neural network.

Figure 6:
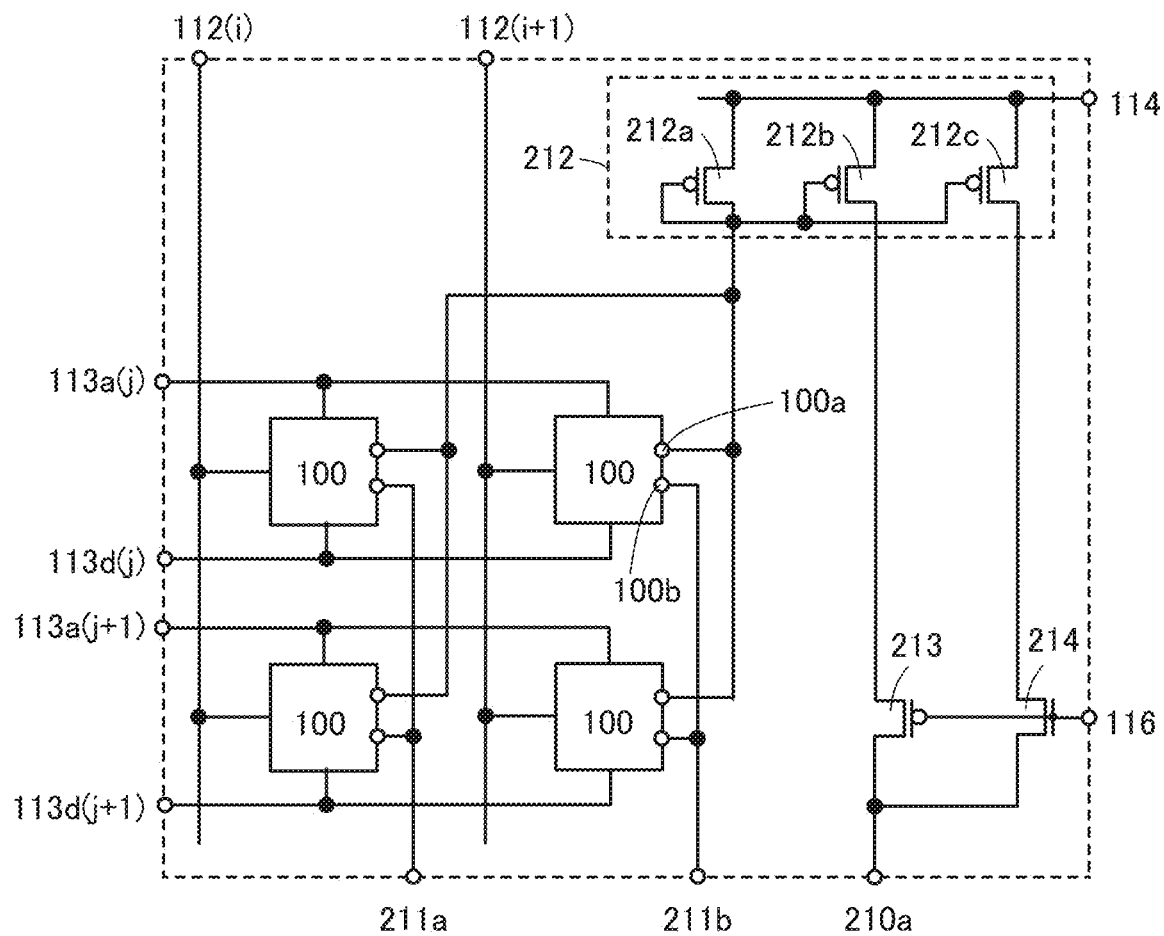
FIG. 6 A block diagram illustrating an imaging device.

FIG. 6 illustrates an example of the pooling circuit 210 having a structure different from that in FIG. 2 using a block diagram. FIG. 6 differs from FIG. 2 in that the pooling circuit 210 includes a plurality of wirings 113*d*, a wiring 211*a*, and a wiring 211*b* and the pixel 100 includes an output terminal 100*b*.

The wiring 113*d* is electrically connected to the plurality of pixels extending in the column direction. The wiring 211*a* is electrically connected to the output terminals 100*b* of the pixels 100 extending in the row direction. Imaging data is output to the wiring 211*a* or the wiring 211*b*. The imaging data is output to the analog/digital converter circuit 250 through the wiring 211*a* and the wiring 211*b*.

Figure 7:
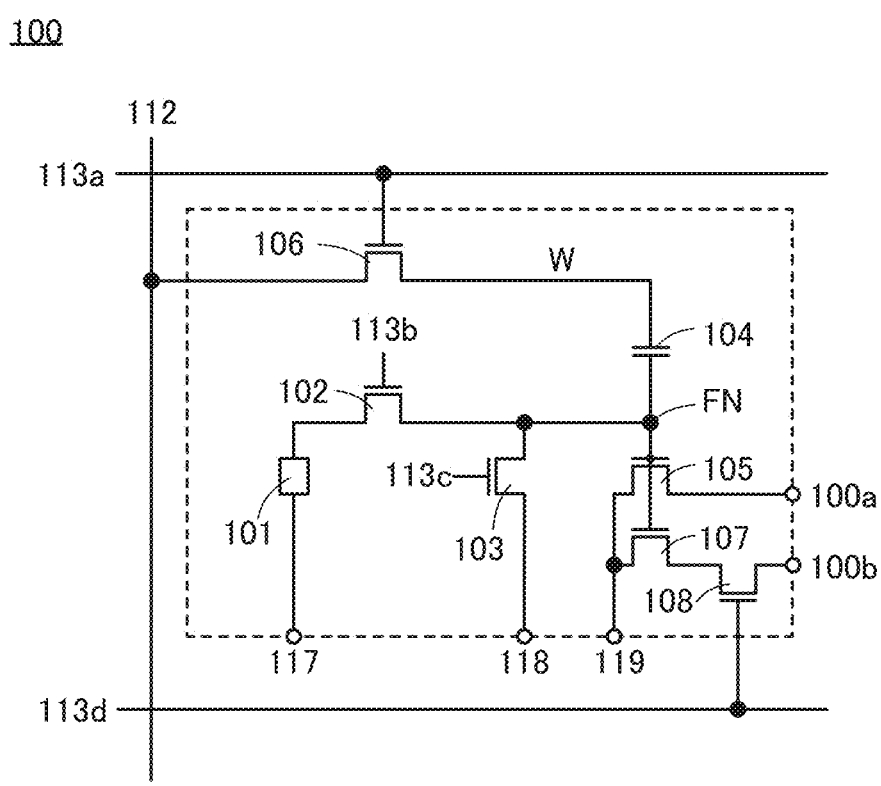
FIG. 7 A circuit diagram illustrating a pixel.

FIG. 7 illustrates an example of the pixel 100 having a structure different from that in FIG. 4. FIG. 7 is different from FIG. 4 in that a transistor 107 and a transistor 108 are included.

A gate of the transistor 107 is electrically connected to the node FN. One of a source and a drain of the transistor 107 is electrically connected to one of a source and a drain of the transistor 108. The other of the source and the drain of the transistor 108 is electrically connected to the output terminal 100*b*. A gate of the transistor 108 is electrically connected to the wiring 113*d*. The other of the source and the drain of the transistor 107 is electrically connected to the wiring 119.

The transistor 107 can supply current depending on the potential of imaging data retained at the node FN. The transistor 108 can output the imaging data to the output terminal 100*b* with a selection signal supplied to the wiring 113*d*. Note that when weight data is set for the capacitor 104, a multiplication result that is obtained by adding the weight data to the imaging data and depends on the conductance of the transistor 105 is output.

The imaging device 10 including the pooling module 200 can easily perform pooling processing. Thus, the amount of data transferred to a neural network is reduced and the arithmetic amount is also reduced, whereby power consumption can be reduced.

The structure and method described in this embodiment can be used by being combined as appropriate with the structures and methods described in the other embodiments.

Embodiment 2

In this embodiment, the photoelectric conversion element 101 used in the imaging device 10 is described with reference to FIG. 8 to FIG. 14.

<Structure Examples of Pixel Circuit>

Figure 8A:
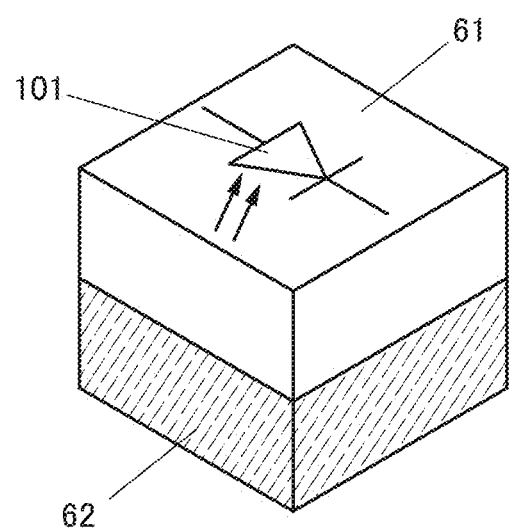
FIG. 8 (A)-(D) Diagrams illustrating structures of a pixel of an imaging device.

FIG. 8(A) illustrates a structure example of a pixel including the above-described pixel circuit. The pixel illustrated in FIG. 8(A) is an example in which a stacked-layer structure of a layer 61 and a layer 62 is included.

The layer 61 includes the photoelectric conversion element 101. As illustrated in FIG. 8(C), the photoelectric conversion element 101 can be a stacked layer of a layer 65*a*, a layer 65*b*, and a layer 65*c*.

The photoelectric conversion element 101 illustrated in FIG. 8(C) is a pn-junction photodiode; for example, a $p^+$-type semiconductor, an n-type semiconductor, and an $n^+$-type semiconductor can be used for the layer 65*a*, the layer 65*b*, and the layer 65*c*, respectively. Alternatively, an $n^+$-type semiconductor, a p-type semiconductor, and a $p^+$-type semiconductor may be used for the layer 65*a*, the layer 65*b*, and the layer 65*c*, respectively. Alternatively, a pin-junction photodiode in which the layer 65*b* is an i-type semiconductor may be used.

The above-described pn-junction photodiode or pin-junction photodiode can be formed using single crystal silicon. Furthermore, the pin-junction photodiode can also be formed using a thin film of amorphous silicon, microcrystalline silicon, polycrystalline silicon, or the like.

Figure 8B:
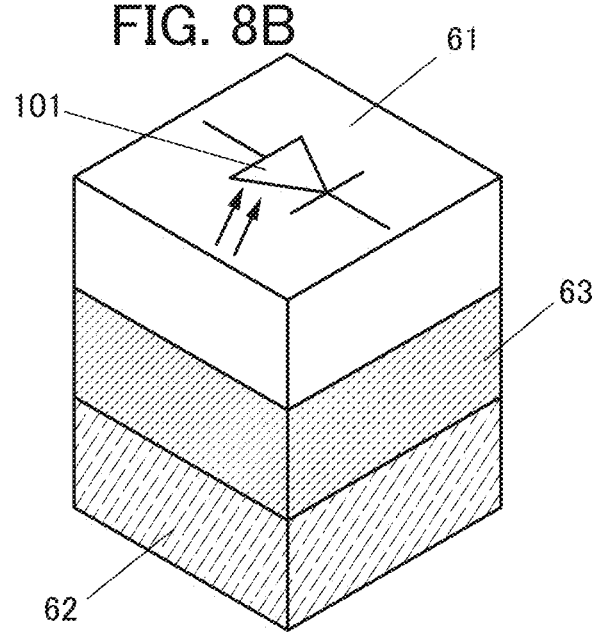
Figure 8C:
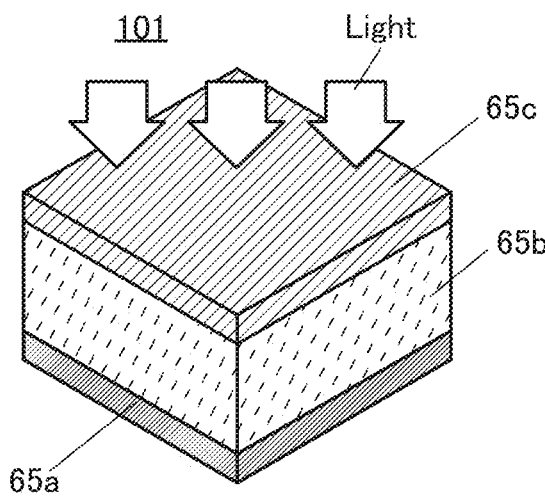
Figure 8D:
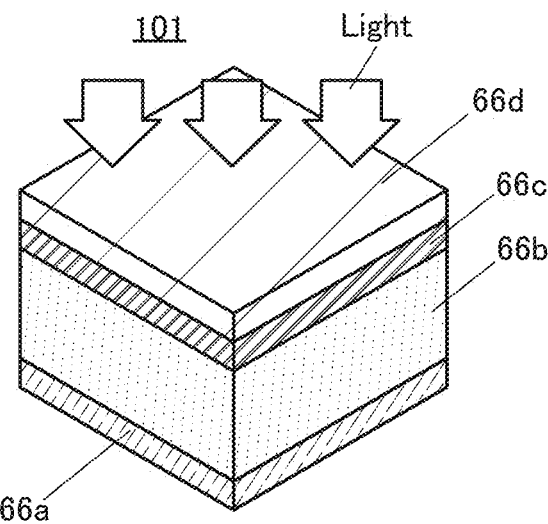

The photoelectric conversion element 101 included in the layer 61 may be a stacked layer of a layer 66*a*, a layer 66*b*, a layer 66*c*, and a layer 66*d* as illustrated in FIG. 8(D). The photoelectric conversion element 101 illustrated in FIG. 8(D) is an example of an avalanche photodiode, and the layer 66*a* and the layer 66*d* correspond to electrodes and the layers 66*b* and 66*c* correspond to a photoelectric conversion portion.

The layer 66*a* is preferably a low-resistance metal layer or the like. For example, aluminum, titanium, tungsten, tantalum, silver, or a stacked layer thereof can be used.

As the layer 66*d*, a conductive layer having a high visible light (Light)-transmitting property is preferably used. For example, indium oxide, tin oxide, zinc oxide, indium tin oxide, gallium zinc oxide, indium gallium zinc oxide, graphene, or the like can be used. Note that the layer 66*d* can be omitted.

The layers 66b and 66c of the photoelectric conversion portion can have, for example, a structure of a pn-junction photodiode with a selenium-based material for a photoelectric conversion layer. A selenium-based material, which is a p-type semiconductor, is preferably used for the layer 66b, and gallium oxide or the like, which is an n-type semiconductor, is preferably used for the layer 66c.

The photoelectric conversion element with a selenium-based material has a property of high external quantum efficiency with respect to visible light. In the photoelectric conversion element, the amount of amplification of electrons with respect to the amount of incident light can be increased by utilizing the avalanche multiplication. A selenium-based material has a high light-absorption coefficient, and thus has advantages in production; for example, a photoelectric conversion layer can be fabricated as a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed with a material having a wide band gap and a visible light-transmitting property. For example, zinc oxide, gallium oxide, indium oxide, tin oxide, or a mixed oxide thereof can be used. In addition, these materials also have a function of a hole injection blocking layer, and a dark current can be decreased.

As the layer 62 illustrated in FIG. 8(A), a silicon substrate can be used, for example. A Si transistor and the like are provided over the silicon substrate, and in addition to the above-described pixel circuit, a circuit for driving the pixel circuit, a circuit for reading an image signal, an image processing circuit, and the like can be provided.

Furthermore, the pixel may have a stacked-layer structure of the layer 61, a layer 63, and the layer 62 as illustrated in FIG. 8(B).

The layer 63 can include OS transistors (for example, the transistors 102 and 103 of the pixel circuit). In that case, the layer 62 preferably includes Si transistors (for example, the transistors 107 and 108 of the pixel circuit).

With such a structure, components of the pixel circuit can be dispersed in a plurality of layers and the components can be provided to overlap with each other, whereby the area of the imaging device can be reduced. Note that in the structure of FIG. 8(B), the layer 62 may be a support substrate, and the pixel 100 and peripheral circuits may be provided in the layer 61 and the layer 63.

<OS Transistor>

As a semiconductor material used for the OS transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that forms the semiconductor layer is an In-M-Zn-based oxide, it is preferable that the atomic ratio of the metal elements of a sputtering target used to deposit the In-M-Zn oxide satisfy In M and Zn M. The atomic ratio of metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratios of metal elements of the sputtering targets in a range of ±40%.

An oxide semiconductor with low carrier density is used as the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

However, the composition is not limited to those, and a material having the appropriate composition may be used depending on required semiconductor characteristics and electrical characteristics of the transistor (field-effect mobility, threshold voltage, or the like). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to be appropriate.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (concentration measured by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor including an oxide semiconductor which contains nitrogen is likely to have normally-on characteristics. Hence, the concentration of nitrogen (concentration measured by secondary ion mass spectrometry) is preferably set to lower than or equal to $5\times10^{18}$ atoms/$cm^3$.

The semiconductor layer may have a non-single-crystal structure, for example. Examples of the non-single-crystal structure include a CAAC-OS including a c-axis aligned crystal (C-Axis Aligned Crystalline Oxide Semiconductor or C-Axis Aligned and A-B-plane Anchored Crystalline Oxide Semiconductor), a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

Meanwhile, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where $GaO_{X3}$ is a main component and the region where $In_{X2}Zn_{Y2}O_{Z2}$ or $InO_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other and form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through the regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility ($\mu$) can be achieved.

Moreover, a semiconductor element using the CAC-OS has high reliability. Thus, the CAC-OS is suitable as a constituent material in a variety of semiconductor devices.

Figure 9A:
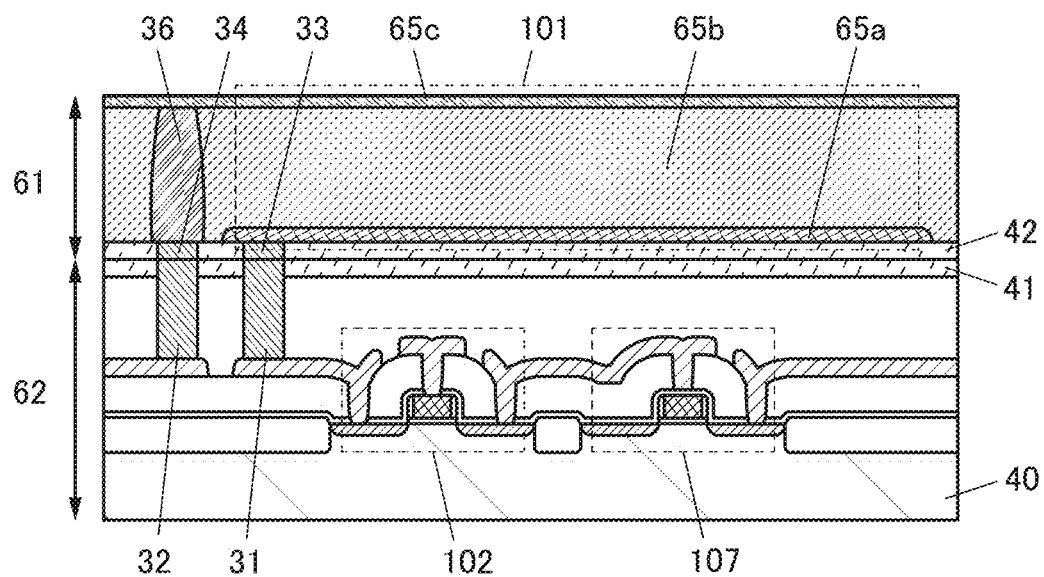
FIG. 9 (A)-(B) Diagrams illustrating structures of a pixel of an imaging device.

FIG. 9(A) is a diagram illustrating an example of a cross section of the pixel illustrated in FIG. 8(A). The layer 61 includes a pn-junction photodiode with silicon for a photoelectric conversion layer, as the photoelectric conversion element 101. The layer 62 includes a Si transistor and the like included in the pixel circuit.

In the photoelectric conversion element 101, the layer 65a can be a $p^+$-type region, the layer 65b can be an n-type region, and the layer 65c can be an $n^+$-type region. In the layer 65b, a region 36 for connection between a power supply line and the layer 65c is provided. For example, the region 36 can be a $p^+$-type region.

Figure 12A:
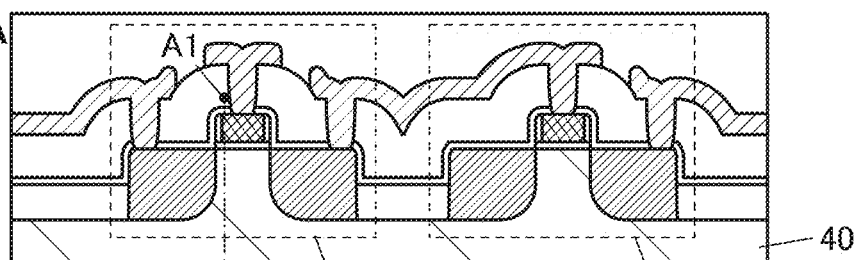
FIG. 12 (A)-(E) Diagrams illustrating structures of a pixel of an imaging device.
Figure 12B:
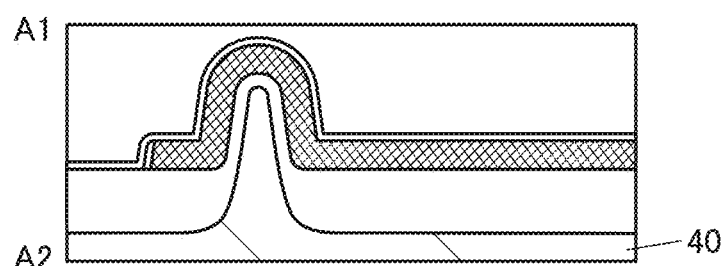

Although the Si transistor illustrated in FIG. 9(A) is of a planar type including a channel formation region in the silicon substrate 40, a structure including a fin semiconductor layer in the silicon substrate 40 as illustrated in FIGS. 12(A) and 12(B) may be employed. FIG. 12(A) corresponds to a cross section in the channel length direction and FIG. 12(B) corresponds to a cross section in the channel width direction.

Figure 12C:
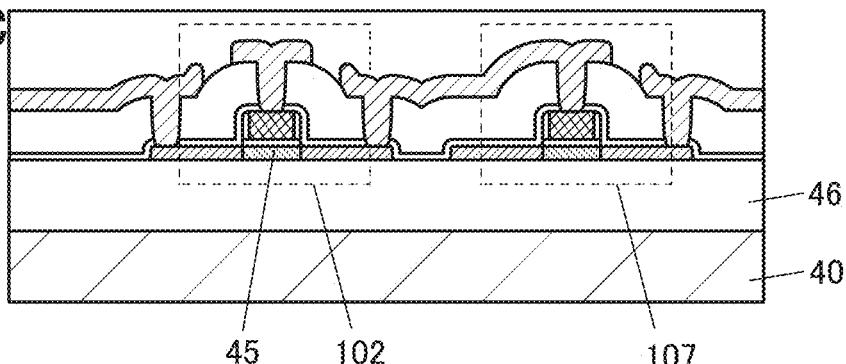

Alternatively, as illustrated in FIG. 12(C), transistors each including a semiconductor layer 45 of a silicon thin film may be used. The semiconductor layer 45 can be single crystal silicon (SOI (Silicon on Insulator)) formed on an insulating layer 46 on the silicon substrate 40, for example.

Here, FIG. 9(A) illustrates a structure example in which electrical connection between elements of the layer 61 and elements of the layer 62 is obtained by bonding technique.

An insulating layer 42, a conductive layer 33, and a conductive layer 34 are provided in the layer 61. The conductive layer 33 and the conductive layer 34 each include a region embedded in the insulating layer 42. The conductive layer 33 is electrically connected to the layer 65a. The conductive layer 34 is electrically connected to the region 36. Furthermore, surfaces of the insulating layer 42, the conductive layer 33, and the conductive layer 34 are planarized to be level with each other.

An insulating layer 41, a conductive layer 31, and a conductive layer 32 are provided in the layer 62. The conductive layer 31 and the conductive layer 32 each include a region embedded in the insulating layer 41. The conductive layer 32 is electrically connected to a power supply line. The conductive layer 31 is electrically connected to the source or the drain of the transistor 102. Furthermore, surfaces of the insulating layer 41, the conductive layer 31, and the conductive layer 32 are planarized to be level with each other.

Here, main components of the conductive layer 31 and the conductive layer 33 are preferably the same metal element. Main components of the conductive layer 32 and the conductive layer 34 are preferably the same metal element. Furthermore, the insulating layer 41 and the insulating layer 42 are preferably formed of the same component.

For example, for the conductive layers 31, 32, 33, and 34, Cu, Al, Sn, Zn, W, Mo, Ag, Pt, Au, or the like can be used. Preferably, Cu, Al, W, or Au is used for easy bonding. In addition, for the insulating layers 41 and 42, silicon oxide, silicon oxynitride, silicon nitride oxide, silicon nitride, titanium nitride, or the like can be used.

That is, the same metal element described above is preferably used for a combination of the conductive layer 31 and the conductive layer 33, and the same metal element described above is preferably used for a combination of the conductive layer 32 and the conductive layer 34. Furthermore, the same insulating material described above is preferably used for the insulating layer 41 and the insulating layer 42. With this structure, bonding in which a boundary between the layer 61 and the layer 62 is a bonding position can be performed.

By the bonding, the electrical connection of each of the combination of the conductive layer 31 and the conductive layer 33 and the combination of the conductive layer 32 and the conductive layer 34 can be obtained. In addition, connection between the insulating layer 41 and the insulating layer 42 with mechanical strength can be obtained.

For bonding the metal layers to each other, a surface activated bonding method in which an oxide film, a layer adsorbing impurities, and the like on the surface are removed by sputtering processing or the like and the cleaned and activated surfaces are brought into contact to be bonded to each other can be used. Alternatively, a diffusion bonding method in which the surfaces are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are brought into contact to be bonded to each other temporarily, and then dehydrated by heat treatment to perform final bonding. The hydrophilic bonding method can also cause bonding at an atomic level; thus, mechanically excellent bonding can be achieved.

When the layer 61 and the layer 62 are bonded together, the insulating layers and the metal layers coexist on their bonding surfaces; therefore, the surface activated bonding method and the hydrophilic bonding method are performed in combination, for example.

For example, a method in which the surfaces are cleaned after polishing, the surfaces of the metal layers are subjected to antioxidant treatment and then hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 9B:
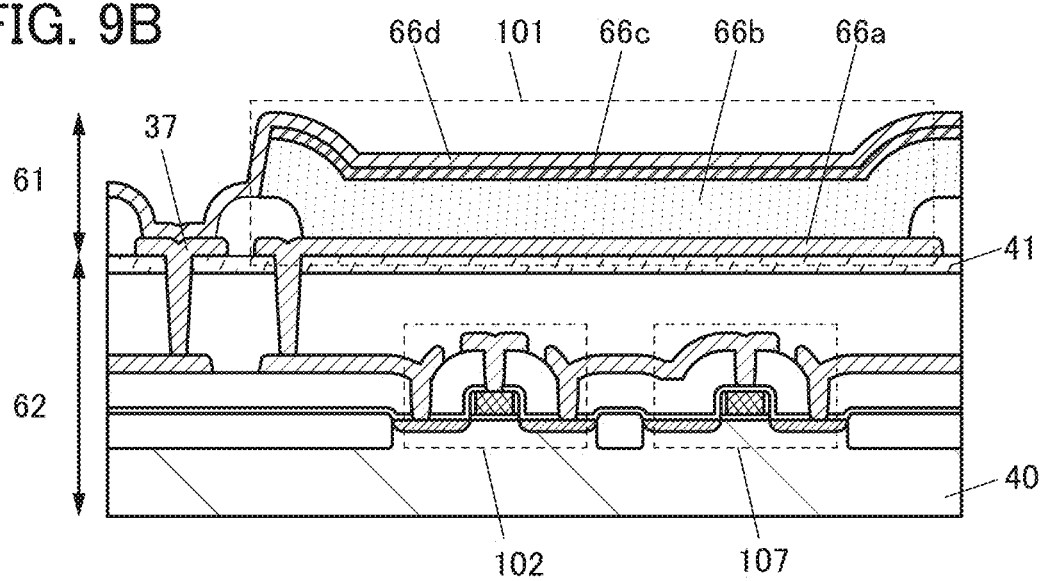

FIG. 9(B) is a cross-sectional view of the case where a pn-junction photodiode with a selenium-based material for a photoelectric conversion layer is used for the layer 61 of the pixel illustrated in FIG. 8(A). The layer 66*a* is included as one electrode, the layers 66*b* and 66*c* are included as the photoelectric conversion layer, and the layer 66*d* is included as the other electrode.

In this case, the layer 61 can be directly formed on the layer 62. The layer 66*a* is electrically connected to the source or the drain of the transistor 102. The layer 66*d* is electrically connected to a power supply line through a conductive layer 37.

Figure 10A:
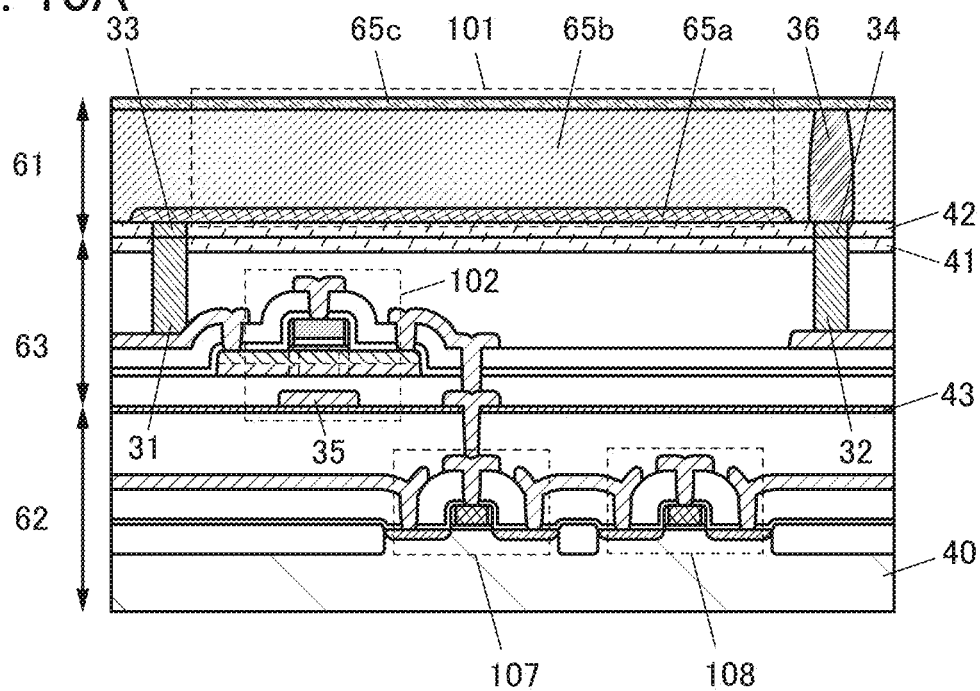
FIG. 10 (A)-(B) Diagrams illustrating structures of a pixel of an imaging device.

FIG. 10(A) is a diagram illustrating an example of a cross section of the pixel illustrated in FIG. 8(B). The layer 61 includes a pn-junction photodiode with silicon for a photoelectric conversion layer, as the photoelectric conversion element 101. The layer 62 includes a Si transistor and the like. The layer 63 includes an OS transistor and the like. A structure example is illustrated in which electrical connection between the layer 61 and the layer 63 is obtained by bonding.

Figure 12D:
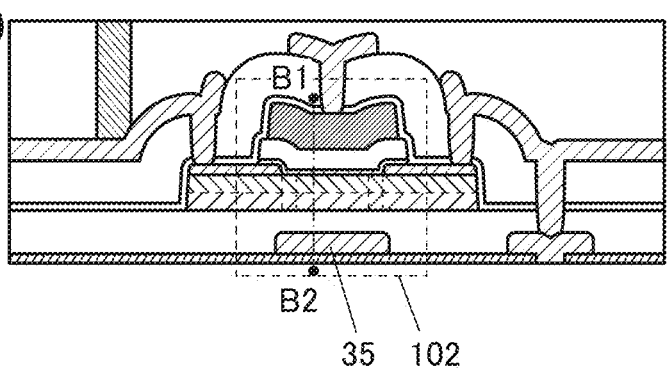

Although the OS transistor having a self-aligned structure is illustrated in FIG. 10(A), a non-self-aligned top-gate transistor may also be used as illustrated in FIG. 12(D).

Figure 12E:
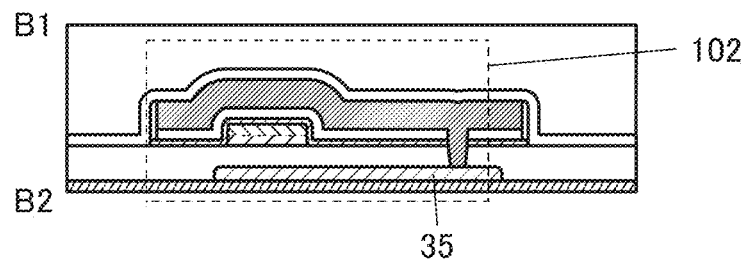

Although the transistor 102 includes a back gate 35, a mode in which the back gate is not included may be employed. As illustrated in FIG. 12(E), the back gate 35 may be electrically connected to a front gate of the transistor, which is provided to face the back gate 35. Alternatively, a structure in which a fixed potential different from that for the front gate can be supplied to the back gate 35 may be employed.

An insulating layer 43 that has a function of inhibiting diffusion of hydrogen is provided between a region where an OS transistor is formed and a region where Si transistors are formed. Dangling bonds of silicon are terminated with hydrogen in insulating layers provided in the vicinity of channel formation regions of the transistors 107 and 108. Meanwhile, hydrogen in an insulating layer provided in the vicinity of a channel formation region of the transistor 102 is one of the factors generating carriers in the oxide semiconductor layer.

Hydrogen is confined in one layer by the insulating layer 43, so that the reliability of the transistors 107 and 108 can be improved. Furthermore, diffusion of hydrogen from the one layer to the other layer is inhibited, so that the reliability of the transistor 102 can also be improved.

For the insulating layer 43, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 10B:
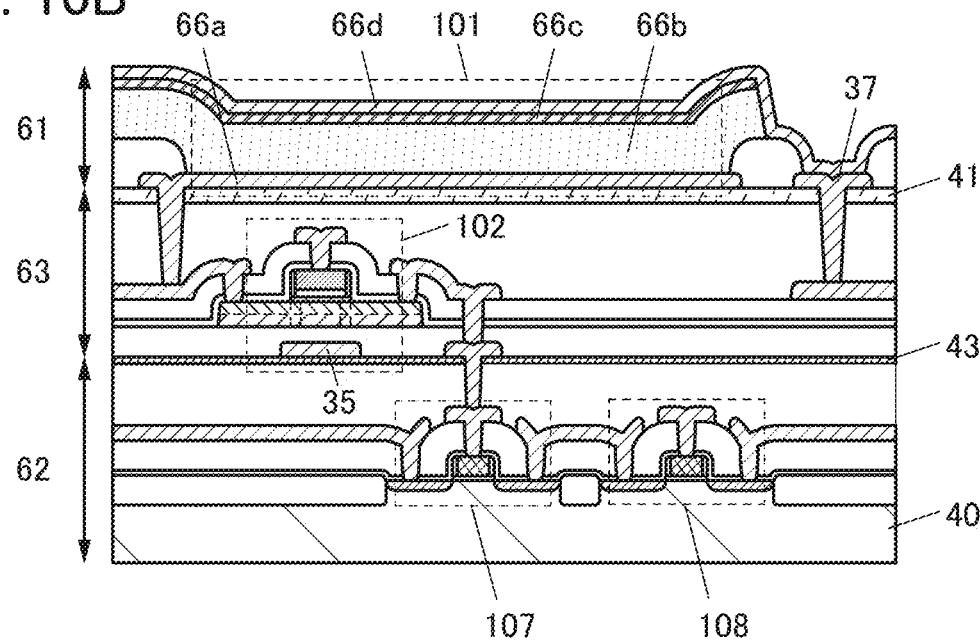

FIG. 10(B) is a cross-sectional view of the case where a pn-junction photodiode with a selenium-based material for a photoelectric conversion layer is used for the layer 61 of the pixel illustrated in FIG. 8(B). The layer 61 can be directly formed on the layer 63. The above description can be referred to for the details of the layers 61, 62, and 63.

Figure 11A:
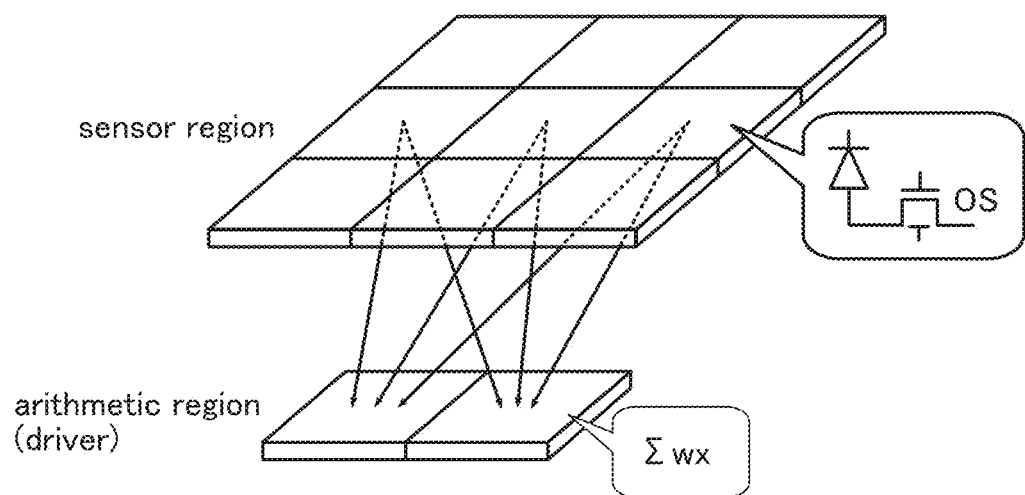
FIG. 11 (A) A diagram illustrating a structure of an imaging device. (B) A cross-sectional view illustrating a structure of an imaging device.

FIG. 11(A) is a diagram illustrating the structure of FIG. 10. A sensor region is composed of the layer 61 including the photoelectric conversion element 101 and the layer 63 including an OS transistor. An arithmetic region is composed of the layer 63 including Si transistors and the like.

The arithmetic region includes the transistors 107 and 108 in the pixel, the pooling circuit of Embodiment 1, and circuits such as the drivers 11, 12, and 13. A stacked-layer structure of the sensor region and the arithmetic region can reduce the circuit area.

Figure 11B:
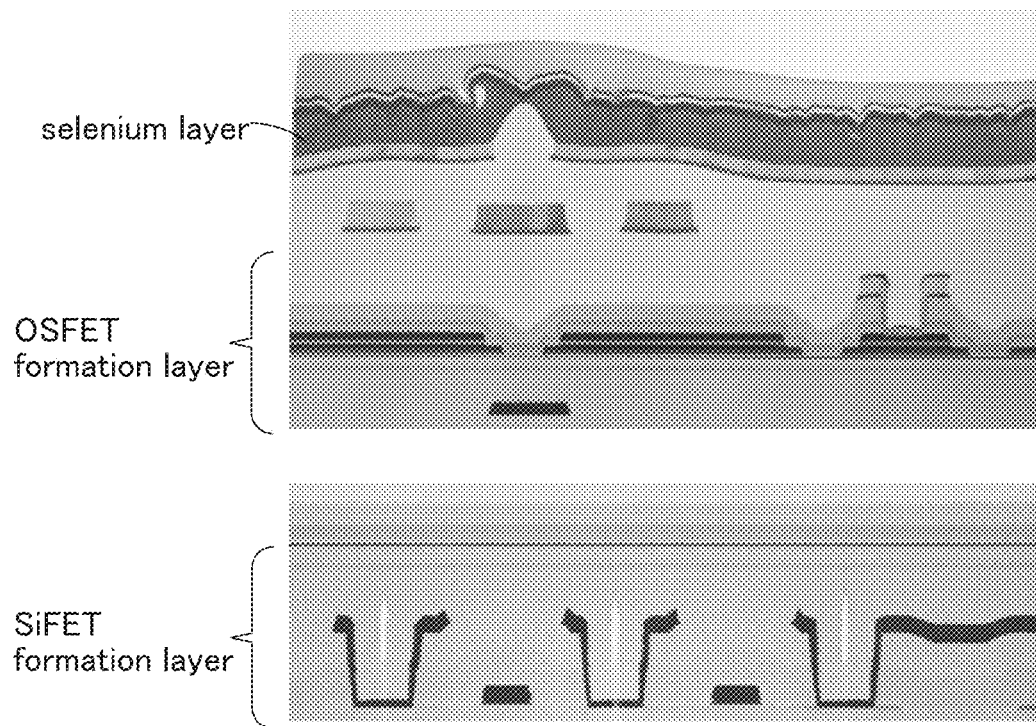

FIG. 11(B) is a cross-sectional photograph of the sensor region and a cross-sectional photograph of the arithmetic region. The sensor region includes an OS transistor (OS-FET) and a pn-junction photodiode with a selenium-based material for a photoelectric conversion layer, and various circuits are formed with a Si transistor (SiFET) in the arithmetic region.

<Other Components of Pixel>

Figure 13A:
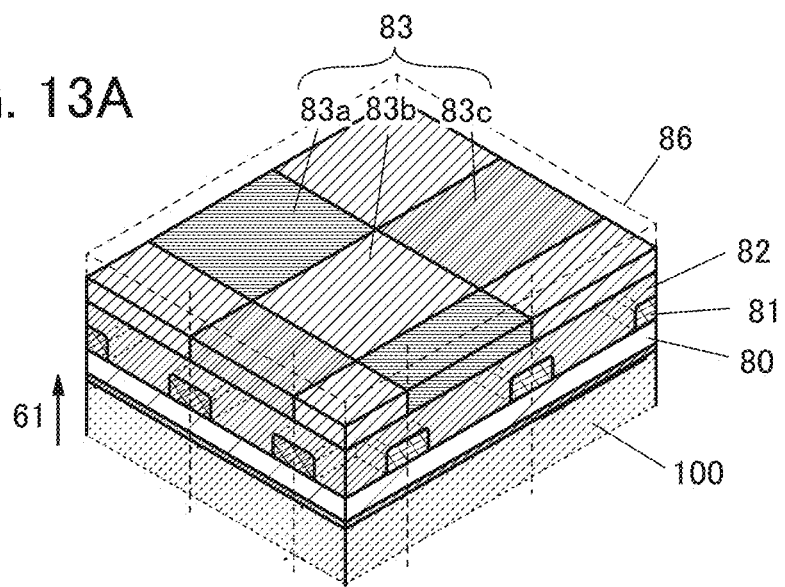
FIG. 13 (A)-(C) Diagrams illustrating structures of a pixel of an imaging device.

FIG. 13(A) is a perspective view illustrating an example in which a color filter and the like are added to the pixel of the imaging device of one embodiment of the present invention. In the perspective view, cross sections of the plurality of pixels are also illustrated. An insulating layer 80 is formed over the layer 61 where the photoelectric conversion element 101 is formed. As the insulating layer 80, a silicon oxide film with a high visible light-transmitting property can be used, for example. A silicon nitride film may be stacked as a passivation film. A dielectric film of hafnium oxide or the like may be stacked as an anti-reflection film.

A light-blocking layer 81 may be formed over the insulating layer 80. The light-blocking layer 81 has a function of preventing color mixing of light passing through the upper color filter. As the light-blocking layer 81, a metal layer of aluminum, tungsten, or the like can be used. The metal layer and a dielectric film having a function of an anti-reflection film may be stacked.

An organic resin layer 82 can be provided as a planarization film over the insulating layer 80 and the light-blocking layer 81. A color filter 83 (color filters 83*a*, 83*b*, and 83*c*) is formed in each pixel. When colors of R (red), G (green), B (blue), Y (yellow), C (cyan), and M (magenta) are assigned to the color filters 83*a*, 83*b*, and 83*c*, for example, a color image can be obtained.

An insulating layer 86 or the like having a visible light-transmitting property can be provided over the color filter 83.

Figure 13B:
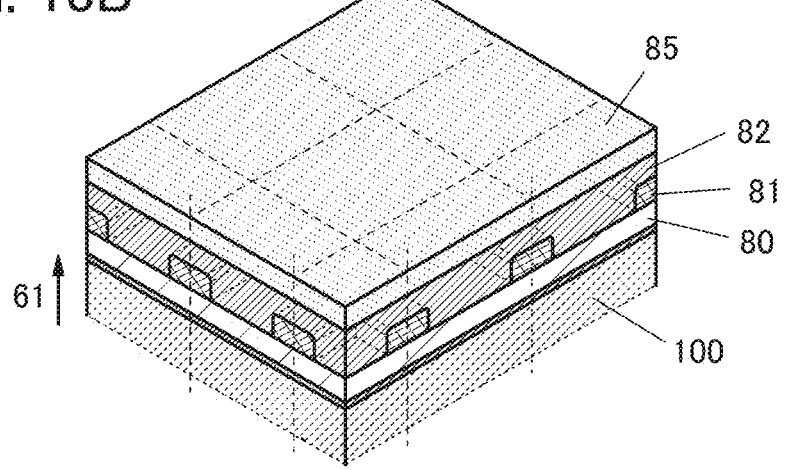

As illustrated in FIG. 13(B), an optical conversion layer 85 may be used instead of the color filter 83. Such a structure enables the imaging device capable of obtaining images in various wavelength regions.

When a filter that blocks light with a wavelength shorter than or equal to that of visible light is used as the optical conversion layer 85, for example, it is possible to obtain an infrared imaging device. When a filter that blocks light with a wavelength shorter than or equal to that of near infrared light is used as the photoelectric conversion layer 85, it is possible to obtain a far-infrared imaging device. When a filter that blocks light with a wavelength longer than or equal to that of visible light is used as the photoelectric conversion layer 85, it is possible to obtain an ultraviolet imaging device. A visible light color filter and an infrared or ultraviolet filter may be combined.

Furthermore, when a scintillator is used as the optical conversion layer 85, it is possible to obtain an imaging device that obtains an image visualizing the intensity of radiation and is used for an X-ray imaging device or the like. Radiations such as X-rays that pass through an object to enter a scintillator are converted into light (fluorescence) such as visible light or ultraviolet light owing to a photoluminescence phenomenon. Then, the light is detected by the photoelectric conversion element 101, whereby image data is obtained. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S$:Tb, $Gd_2O_2S$:Pr, $Gd_2O_2S$:Eu, $BaFCl$:Eu, NaI, CsI, $CaF_2$, $BaF_2$, $CeF_3$, LiF, LiI, ZnO, or the like is dispersed.

In the photoelectric conversion element 101 using a selenium-based material, radiation such as X-rays can be directly converted into charge; thus, a structure in which the scintillator is unnecessarily can also be employed.

Figure 13C:
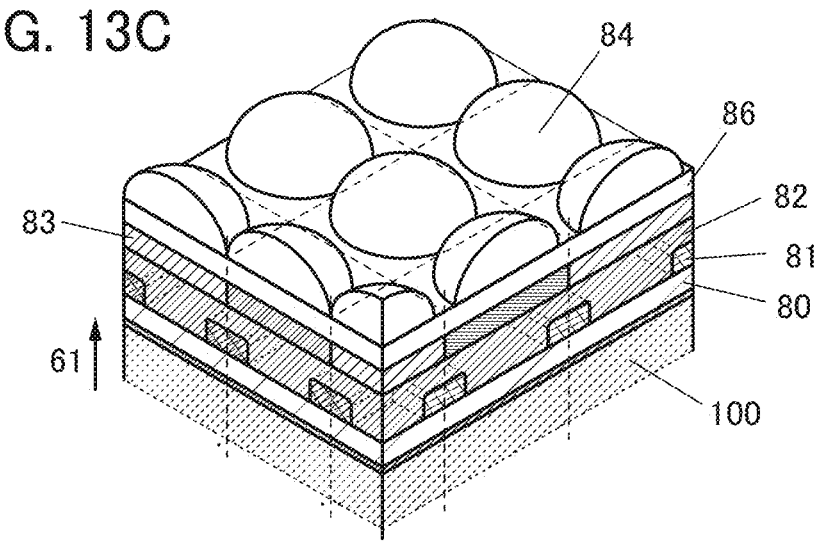

As illustrated in FIG. 13(C), a microlens array 84 may be provided over the color filter 83. Light passing through lenses of the microlens array 84 goes through the color filter 83 positioned thereunder and the photoelectric conversion element 101 is irradiated with the light. The microlens array 84 may be provided over the optical conversion layer 85 illustrated in FIG. 13(B).

<Structure Examples of Package and Module>

Hereinafter, examples of a package and a camera module in each of which an image sensor chip is placed will be described. For the image sensor chip, the structure of the above-described imaging device can be used.

FIG. 14(A1) is an external perspective view of the top surface side of a package in which an image sensor chip is placed. The package includes a package substrate 410 to which an image sensor chip 450 is fixed, a cover glass 420, an adhesive 430 for bonding the package substrate 410 and the cover glass 420, and the like.

FIG. 14(A2) is an external perspective view of the bottom surface side of the package. A BGA (Ball grid array) in which solder balls serve as bumps 440 is provided on the bottom surface of the package. Note that, not limited to the BGA, an LGA (Land grid array), a PGA (Pin Grid Array), or the like may be provided.

FIG. 14(A3) is a perspective view of the package, in which some parts of the cover glass 420 and the adhesive 430 are not illustrated. Electrode pads 460 are formed over the package substrate 410, and the electrode pads 460 and the bumps 440 are electrically connected via through-holes. The electrode pads 460 are electrically connected to the image sensor chip 450 through wires 470.

Furthermore, FIG. 14(B1) is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 having functions of a driver circuit, a signal conversion circuit, and the like of an imaging device is provided between the package substrate 411 and the image sensor chip 451; thus, the structure as an SiP (System in package) is included.

FIG. 14(B2) is an external perspective view of the bottom surface side of the camera module. On the bottom surface and side surfaces of the package substrate 411, a QFN (Quad flat no-lead package) structure in which lands 441 for mounting are provided is used. Note that this structure is an example, and a QFP (Quad flat package) or the above-mentioned BGA may be employed.

FIG. 14(B3) is a perspective view of the module, in which some parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

The structure and method described in this embodiment can be used by being combined as appropriate with the structures and methods described in the other embodiments.

Embodiment 3

As electronic devices that can include an imaging device of one embodiment of the present invention, display devices, personal computers, image memory devices or image reproducing devices provided with a recording medium, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 15 illustrates specific examples of these electronic devices.

Figure 15A:
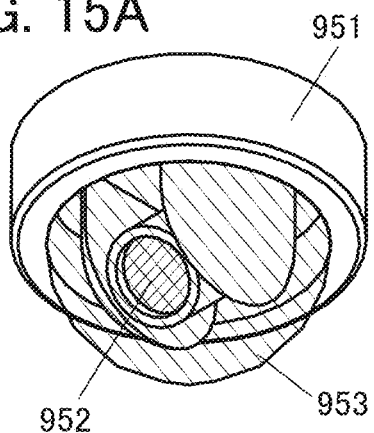
FIG. 15 (A)-(F) Drawings illustrating structure examples of electronic devices.

FIG. 15(A) is a surveillance camera which includes a support base 951, a camera unit 952, a protective cover 953, and the like. The camera unit 952 is provided with a rotation mechanism and the like and can capture an image of all of the surroundings when provided on a ceiling. The imaging device of one embodiment of the present invention can be included, as a component for obtaining an image, in the camera unit. Note that a surveillance camera is a name in common use and does not limit the use thereof. A device that has a function of a surveillance camera can also be called a camera or a video camera, for example.

Figure 15B:
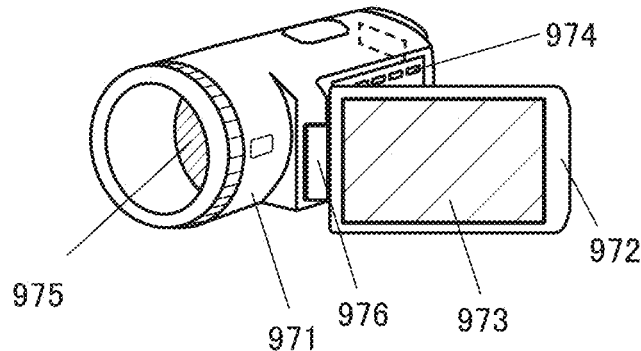

FIG. 15(B) is a video camera which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included, as a component for obtaining an image, in the video camera.

Figure 15C:
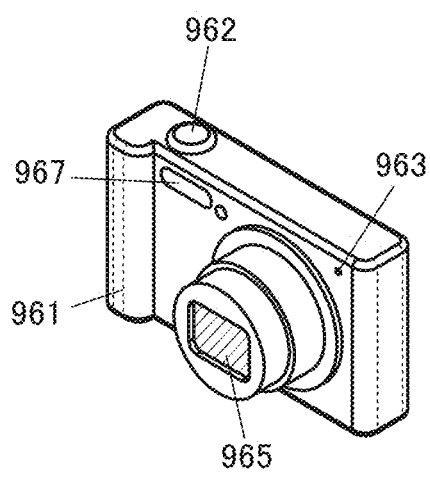

FIG. 15(C) is a digital camera which includes a housing 961, a shutter button 962, a microphone 963, a light-emitting portion 967, a lens 965, and the like. The imaging device of one embodiment of the present invention can be included, as a component for obtaining an image, in the digital camera.

Figure 15D:
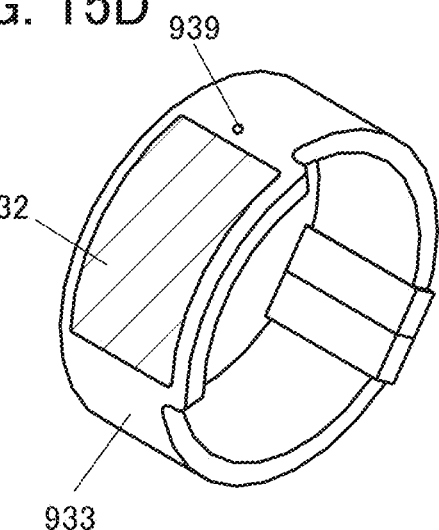

FIG. 15(D) is a wrist-watch-type information terminal which includes a display portion 932, a housing 933 also serving as a wristband, a camera 939, and the like. The display portion 932 is provided with a touch panel for operating the information terminal. The display portion 932 and the housing 933 also serving as a wristband have flexibility and fit a body well. The imaging device of one embodiment of the present invention can be included, as a component for obtaining an image, in the information terminal.

Figure 15E:
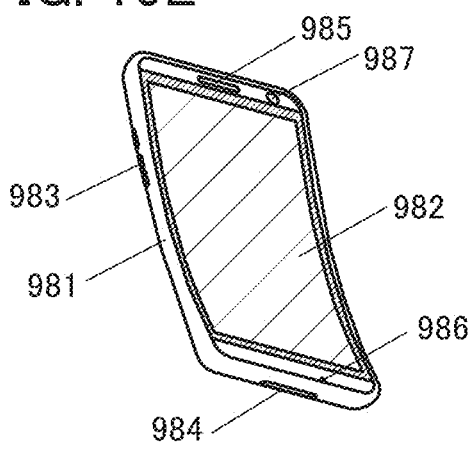

FIG. 15(E) is an example of a cellular phone which includes a housing 981, a display portion 982, an operation button 983, an external connection port 984, a speaker 985, a microphone 986, a camera 987, and the like. The display portion 982 of the cellular phone includes a touch sensor. All operations including making a call and inputting text can be performed by touch on the display portion 982 with a finger, a stylus, or the like. The imaging device of one embodiment of the present invention can be included, as a component for obtaining an image, in the cellular phone.

Figure 15F:
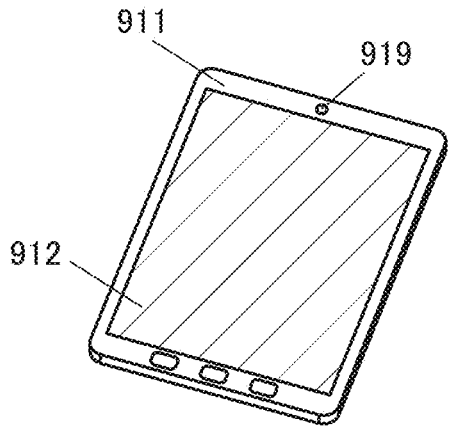

FIG. 15(F) is a portable data terminal which includes a housing 911, a display portion 912, a camera 919, and the like. Input and output of information can be performed by a touch panel function of the display portion 912. The imaging device of one embodiment of the present invention can be included, as a component for obtaining an image, in the portable data terminal.

Note that this embodiment can be combined with the description of other embodiments as appropriate.

In this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL (electroluminescence) element (an EL element including organic and inorganic materials, an organic EL element, or an inorganic EL element), an LED chip (a white LED chip, a red LED chip, a green LED chip, a blue LED chip, or the like), a transistor (a transistor that emits light depending on a current), a plasma display panel (PDP), an electron emitter, a display element including a carbon nanotube, a liquid crystal element, electronic ink, an electrowetting element, an electrophoretic element, a display element using MEMS (micro electro mechanical systems) (for example, a grating light valve (GLV), a digital micromirror device (DMD), a DMS (digital micro shutter), MIRASOL (a registered trademark), an IMOD (interferometric modulation) element, a MEMS shutter display element, an optical-interference-type MEMS display element, or a piezoelectric ceramic display), and quantum dots. Other than the above, the display element, the display device, the light-emitting element, or the light-emitting device may include a display media whose contrast, luminance, reflectivity, transmittance, or the like changes by electrical or magnetic effect. Examples of a display device having EL elements include an EL display. Examples of a display device including an electron emitter include a field emission display (FED) and an SED-type flat panel display (SED: Surface-conduction Electron-emitter Display). Examples of a display device using a liquid crystal element include a liquid crystal display (a transmissive liquid crystal display, a transflective liquid crystal display, a reflective liquid crystal display, a direct-view liquid crystal display, or a projection liquid crystal display). Examples of display devices using electronic ink, electronic liquid powder (a registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. Note that in the case of achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as SRAM can be provided under the reflective electrodes. Thus, the power consumption can be further reduced. Note that in the case where an LED chip is used, graphene or graphite may be provided under an electrode or a nitride semiconductor of the LED chip. Graphene or graphite may be a multilayer film in which a plurality of layers are stacked. Providing graphene or graphite in the above manner facilitates formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between graphene or graphite and the n-type GaN semiconductor layer including crystals. The GaN semiconductor layer included in the LED chip may be formed by MOCVD. Note that when graphene is provided, the GaN semiconductor layer included in the LED chip can also be formed by a sputtering method. In the case of a display element including MEMS (microelectromechanical systems), a drying agent may be provided in a space where the display element is sealed (for example, between an element substrate over which the display element is placed and a counter substrate provided opposite to the element substrate). Providing a drying agent can prevent MEMS and the like from becoming difficult to move or deteriorating easily because of moisture.

Note that this embodiment can be combined with other embodiments in this specification as appropriate.

Notes on the Description in this Specification and the Like

The following are notes on the description of the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or more of different embodiments, for example.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or more of different embodiments, much more diagrams can be formed.

Notes on Ordinal Numbers

Ordinal numbers such as "first", "second", and "third" in this specification and the like are used in order to avoid confusion among components. Thus, the number of components is not limited. In addition, the order of components is not limited. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

Notes on Description for Drawings

Embodiments are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under", are used for convenience for describing the positional relation between components with reference to drawings. The positional relation between components is changed as appropriate in accordance with a direction in which the components are described. Thus, terms for describing arrangement are not limited to those described in this specification and can be rephrased as appropriate according to circumstances.

Furthermore, the term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

Notes on Expressions that can be Rephrased

In this specification and the like, one of a source and a drain is denoted by "one of a source and a drain" (or a first electrode or a first terminal) and the other of the source and the drain is denoted by "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Furthermore, in the case where a transistor described in this specification and the like has two or more gates (such a structure is referred to as a dual-gate structure in some cases), these gates are referred to as a first gate and a second gate or as a front gate and a back gate in some cases. In particular, the term "front gate" can be replaced with a simple term "gate". The term "back gate" can be replaced with a simple term "gate". Note that a bottom gate is a terminal that is formed before a channel formation region in manufacture of a transistor, and a "top gate" is a terminal that is formed after a channel formation region in manufacture of a transistor.

A transistor has three terminals referred to as a gate, a source, and a drain. A gate is a terminal that functions as a control terminal that controls the conduction state of a transistor. Depending on the type of the transistor or levels of potentials supplied to the terminals, one of two input/output terminals functions as a source and the other functions as a drain. Therefore, the terms "source" and "drain" can be used interchangeably in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film", "layer", and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring", "signal line", "power source line", and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

Notes on Definitions of Terms

Definitions of the terms mentioned in the above embodiments will be explained below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies may be formed by entry of impurities such as hydrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

<<Transistor>>

In this specification, a transistor is an element having at least three terminals including a gate, a drain, and a source. A channel formation region is included between the drain (a drain terminal, a drain region, or a drain electrode) and the source (a source terminal, a source region, or a source electrode). When a voltage which exceeds the threshold voltage is supplied between the gate and the source, a channel is formed in the channel formation region, whereby current can flow between the source and the drain.

Furthermore, functions of a source and a drain are sometimes interchanged with each other when transistors having different polarities are used or when the direction of current is changed in circuit operation, for example. Therefore, the terms "source" and "drain" can be interchanged in this specification and the like.

<<Switch>>

In this specification and the like, a switch is in a conduction state (on state) or in a non-conduction state (off state) to determine whether a current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether a current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "being electrically connected" is the same as the explicit simple expression "being connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, "substantially parallel" indicates a state where the angle formed between two straight lines is greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. In addition, "substantially perpendicular" indicates a state where the angle formed between two straight lines is greater than or equal to 60° and less than or equal to 120°.

REFERENCE NUMERALS

10: imaging device, 11: driver, 12: driver, 13: driver, 31: conductive layer, 32: conductive layer, 33: conductive layer, 34: conductive layer, 35: back gate, 36: region, 37: conductive layer, 40: silicon substrate, 41: insulating layer, 42: insulating layer, 43: insulating layer, 45: semiconductor layer, 46: insulating layer, 80: insulating layer, 81: light-blocking layer, 82: organic resin layer, 83: color filter, 83$a$: color filter, 83$b$: color filter, 83$c$: color filter, 84: microlens array, 85: photoelectric conversion layer, 86: insulating layer, 100: pixel, 100$a$: output terminal, 100$b$: output terminal, 101: photoelectric conversion element, 102: transistor, 103: transistor, 104: capacitor, 105: transistor, 106: transistor, 107: transistor, 108: transistor, 111: wiring, 112: wiring, 113$a$: wiring, 113$b$: wiring, 113$c$: wiring, 113$d$: wiring, 114: wiring, 115: wiring, 117: wiring, 118: wiring, 119: wiring, 200: pooling module, 203: switch, 204: switch, 210: pooling circuit, 210$a$: wiring, 211: wiring, 211$a$: wiring, 211$b$: wiring, 212: arithmetic circuit, 212$a$: transistor, 212$b$: transistor, 212$c$: transistor, 220: comparison module, 221: determination circuit, 221$a$: input terminal, 221$b$: input terminal, 221$c$: output terminal, 223$a$: transistor, 223$b$: transistor, 224$a$: input terminal, 224$b$: output terminal, 230: comparison circuit, 230$a$: comparison circuit, 230$b$: comparison circuit, 230$c$: comparison circuit, 231$a$: input terminal, 231$b$: input terminal, 231$c$: output terminal, 232: wiring, 236: transistor, 241: transistor, 242: transistor, 243: transistor, 244: transistor, 245: transistor, 246: transistor, 250: analog/digital converter circuit, 251: output circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 911: housing, 912: display portion, 919: camera, 932: display portion, 933: housing also serving as wristband, 939: camera, 951: support base, 952: camera unit, 953: protective cover, 961: housing, 962: shutter button, 963: microphone, 965: lens, 967: light-emitting portion, 971: housing, 972: housing, 973: display portion, 974: operation key, 975: lens, 976: connection portion, 981: housing, 982: display portion, 983: operation button, 984: external connection port, 985: speaker, 986: microphone, 987: camera

The invention claimed is:

1. An imaging device comprising:
a plurality of pixels in an imaging region; and
a current mirror circuit comprising a first transistor and a second transistor,
wherein each pixel comprises a photoelectric conversion element and a third transistor,
wherein the photoelectric conversion element is positioned over an insulating layer,
wherein the third transistor is positioned under the insulating layer,
wherein the current mirror circuit is positioned under the third transistor,
wherein the plurality of pixels and the current mirror circuit overlap with each other,
wherein the plurality of pixels comprises a first plurality of pixels and a second plurality of pixels,
wherein one of a source and a drain of the first transistor is electrically connected to a first wiring to which a current based on an analog signal obtained from the first plurality of pixels is input,
wherein the one of the source and the drain of the first transistor is electrically connected to a gate of the first transistor,
wherein the other of the source and the drain of the first transistor is electrically connected to one of a source and a drain of the second transistor,
wherein the other of the source and the drain of the second transistor is electrically connected to a second wiring to which a current based on an analog signal obtained from the second plurality of pixels is input, and wherein a gate of the second transistor is electrically connected to the gate of the first transistor.

2. The imaging device according to claim 1, wherein the third transistor included in the plurality of pixels is an n-channel transistor, and wherein the first transistor and the second transistor are p-channel transistors.

3. An imaging device comprising:

an imaging region; and a current mirror circuit comprising a first input terminal and a second input terminal, wherein the imaging region comprises a photoelectric conversion element and a transistor, wherein the photoelectric conversion element is positioned over an insulating layer, wherein the transistor is positioned under the insulating layer, wherein the current mirror circuit is positioned under the transistor, wherein the imaging region and the current mirror circuit overlap with each other, wherein a first analog signal obtained from a pixel portion in the imaging region is input to the first input terminal, wherein a second analog signal obtained from the pixel portion in the imaging region is input to the second input terminal, and wherein at least one of the first analog signal or the second analog signal is a current obtained by averaging current based on analog signals obtained by a plurality of pixels included in the pixel portion.

4. The imaging device according to claim 3, wherein the transistor included in the plurality of pixels is an n-channel transistor, and wherein transistors included in the current mirror circuit are p-channel transistors.

* * * * *